(12) United States Patent
Choi et al.

(10) Patent No.: US 11,063,090 B2
(45) Date of Patent: Jul. 13, 2021

(54) IMAGE SENSOR AND METHOD FOR FABRICATING THE SAME

(71) Applicant: Samsung Electronics Co., Ltd., Suwon-si (KR)

(72) Inventors: Min Jun Choi, Hwaseong-si (KR); Kwan Sik Kim, Seoul (KR); Chang Hwa Kim, Hwaseong-si (KR); Sang Su Park, Seoul (KR); Man Geun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/391,616

(22) Filed: Apr. 23, 2019

(65) Prior Publication Data

US 2020/0058707 A1 Feb. 20, 2020

(30) Foreign Application Priority Data

Aug. 14, 2018 (KR) .................. 10-2018-0094843

(51) Int. Cl.
| | |
|---|---|
| *H01L 27/30* | (2006.01) |
| *H04N 5/378* | (2011.01) |
| *H01L 49/02* | (2006.01) |
| *H01L 27/146* | (2006.01) |

(52) U.S. Cl.
CPC ........... *H01L 27/307* (2013.01); *H01L 28/40* (2013.01); *H04N 5/378* (2013.01); *H01L 27/1463* (2013.01); *H01L 27/14621* (2013.01); *H01L 27/14627* (2013.01); *H01L 27/14636* (2013.01); *H01L 27/14643* (2013.01); *H01L 27/14689* (2013.01)

(58) Field of Classification Search
CPC ............ H01L 27/307; H01L 27/14621; H01L 27/14627; H01L 27/1463; H01L 27/14636; H01L 27/14643; H01L 27/14689; H01L 28/40; H04N 5/378
See application file for complete search history.

(56) References Cited

U.S. PATENT DOCUMENTS

| | | | |
|---|---|---|---|
| 5,686,976 A * | 11/1997 | Nishikawa | G02F 1/136213 349/38 |
| 6,549,258 B1 * | 4/2003 | Shin | G02F 1/134363 349/141 |
| 8,184,189 B2 | 5/2012 | Tamura | |
| 8,917,341 B2 | 12/2014 | Sakano et al. | |

(Continued)

*Primary Examiner* — Kyoung Lee
*Assistant Examiner* — Christina A Sylvia
(74) *Attorney, Agent, or Firm* — Harness, Dickey & Pierce, P.L.C.

(57) ABSTRACT

An image sensor and a method for fabricating the same are provided. The image sensor includes a substrate including a first surface opposite a second surface that is incident to light, a first photoelectric conversion layer in the substrate, a wiring structure including a plurality of wiring layers on the first surface of the substrate, an interlayer insulating film on the second surface of the substrate, a capacitor structure in the interlayer insulating film, and a first wiring on the interlayer insulating film. The capacitor structure includes a first conductive pattern, a dielectric pattern, and a second conductive pattern sequentially stacked on the second surface of the substrate. The second conductive pattern is connected to the first wiring.

19 Claims, 18 Drawing Sheets

(56) References Cited

U.S. PATENT DOCUMENTS

| | | |
|---|---|---|
| 9,711,559 B2 | 7/2017 | Sakano et al. |
| 9,722,107 B2 | 8/2017 | Tashiro et al. |
| 9,780,130 B2 | 10/2017 | Suh et al. |
| 9,826,181 B2 | 11/2017 | Tashiro et al. |
| 9,917,119 B2 | 3/2018 | Murakami et al. |
| 9,941,315 B2 | 4/2018 | Tashiro |
| 2010/0134646 A1* | 6/2010 | Tamura ............. H01L 27/14623 348/222.1 |
| 2016/0191825 A1 | 6/2016 | Sato et al. |
| 2017/0170239 A1* | 6/2017 | Lee ................... H01L 27/14645 |
| 2018/0190707 A1* | 7/2018 | Lee ................... H01L 27/14645 |

\* cited by examiner

IMAGE SENSOR AND METHOD FOR FABRICATING THE SAME

This application claims priority to Korean Patent Application No. 10-2018-0094843, filed on Aug. 14, 2018, and all the benefits accruing therefrom under 35 U.S.C. § 119, the disclosure of which is incorporated herein by reference in its entirety.

BACKGROUND

1. Technical Field

Inventive concepts relate to an image sensor and a method for fabricating the same. More specifically, inventive concepts relate to a backside illumination (BSI) type image sensor and a method for fabricating the same.

2. Description of Related Art

An image sensor may convert optical information into electric signals. Such an image sensor may include a charge coupled device (CCD) image sensor and a complementary metal-oxide semiconductor (CMOS) image sensor.

Recently, a backside illumination (BSI) type image sensor, in which incident light is radiated through a backside of a semiconductor substrate and photoelectrically converted so that the pixels formed in the image sensor have improved light-receiving efficiency and sensitivity, is being researched.

SUMMARY

Aspects of inventive concepts provide an image sensor in which a large capacity capacitor is implemented and a degree of integration is improved.

Aspects of inventive concepts also provide a method for fabricating an image sensor capable of fabricating an image sensor in which a large capacity capacitor is implemented and performance and degree of integration are improved.

However, aspects of inventive concepts are not restricted to the ones set forth herein. The above and other aspects of inventive concepts will become more apparent to one of ordinary skill in the art to which inventive concepts pertains by referencing the detailed description of inventive concepts given below.

According to aspects of inventive concepts, an image sensor includes a substrate including a first surface and a second surface, the second surface being opposite the first surface and configured to be light incident; a first photoelectric conversion layer in the substrate; a wiring structure on the first surface of the substrate, the wiring structure including a plurality of wiring layers; an interlayer insulating film on the second surface of the substrate; a capacitor structure in the interlayer insulating film, the capacitor structure including a first conductive pattern, a dielectric pattern, and a second conductive pattern sequentially stacked on the second surface of substrate; and a first wiring on the interlayer insulating film. The first wiring is connected to the second conductive pattern.

According to aspects of inventive concepts, an image sensor includes a substrate including a sensor array region and a peripheral circuit region, the substrate including a first surface and a second surface, the second surface being opposite the first surface and being configured to be light incident; a first photoelectric conversion layer in the sensor array region; a color filter on the second surface of the sensor array region; a capacitor structure on the second surface of the peripheral circuit region, the capacitor structure including a first conductive pattern, a dielectric pattern, and a second conductive pattern sequentially stacked; an interlayer insulating film that covers the color filter and the capacitor structure; a first electrode that extends along an upper surface of the interlayer insulating film in the sensor array region; a second photoelectric conversion layer on the first electrode; and a first wiring extending along an upper surface of the interlayer insulating film in the peripheral circuit region. The first wiring is connected to the second conductive pattern.

According to aspects of inventive concepts, an image sensor includes a substrate including a first surface and a second surface that is opposite the first surface and configured to be light incident; a first photoelectric conversion layer in the substrate; a capacitor structure on the second surface of the substrate, the capacitor structure including a first conductive pattern, a dielectric pattern and a second conductive pattern sequentially stacked; an interlayer insulating film that covers the capacitor structure; a first wiring extending along a part of an upper surface of the interlayer insulating film, the first wiring including indium tin oxide (ITO); and a first contact penetrating the interlayer insulating film and being connected to the second conductive pattern and the first wiring. The image sensor may be configured to apply different voltages to the first conductive pattern and the second conductive pattern.

According to aspects of inventive concepts, a method for fabricating an image sensor includes forming a first photoelectric conversion layer in a substrate, the substrate including a first surface and a second surface opposite the first surface, the second surface being configured to be light incident; forming a wiring structure on the first surface of the substrate, the wiring structure including a plurality of wiring layers; forming a capacitor structure on the second surface of the substrate, the capacitor structure including a first conductive pattern, a dielectric pattern, and a second conductive pattern sequentially stacked; forming an interlayer insulating film that covers the capacitor structure; forming a contact in the interlayer insulating film, the contact penetrating the interlayer insulating film and being connected to the second conductive pattern; and forming a wiring on the interlayer insulating film, the wiring connected to the contact.

BRIEF DESCRIPTION OF THE DRAWINGS

The above and other aspects and features of inventive concepts will become more apparent by describing in detail example embodiments thereof with reference to the attached drawings, in which.

DETAILED DESCRIPTION

Hereinafter, an image sensor according to some embodiments of inventive concepts will be described with reference to FIGS. 1 to 15.

Figure 1:
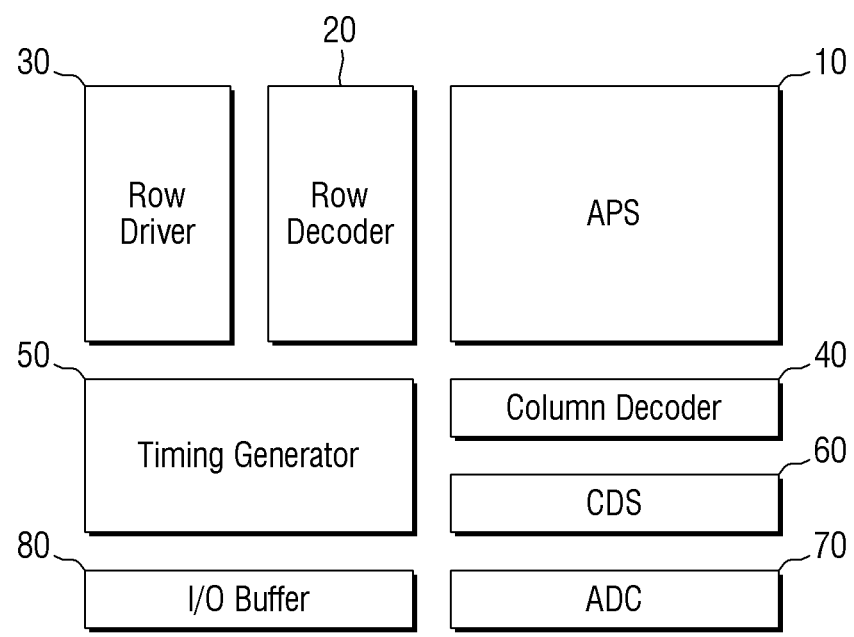
FIG. 1 is a block diagram of an image sensor according to some embodiments of inventive concepts.
Figure 2:
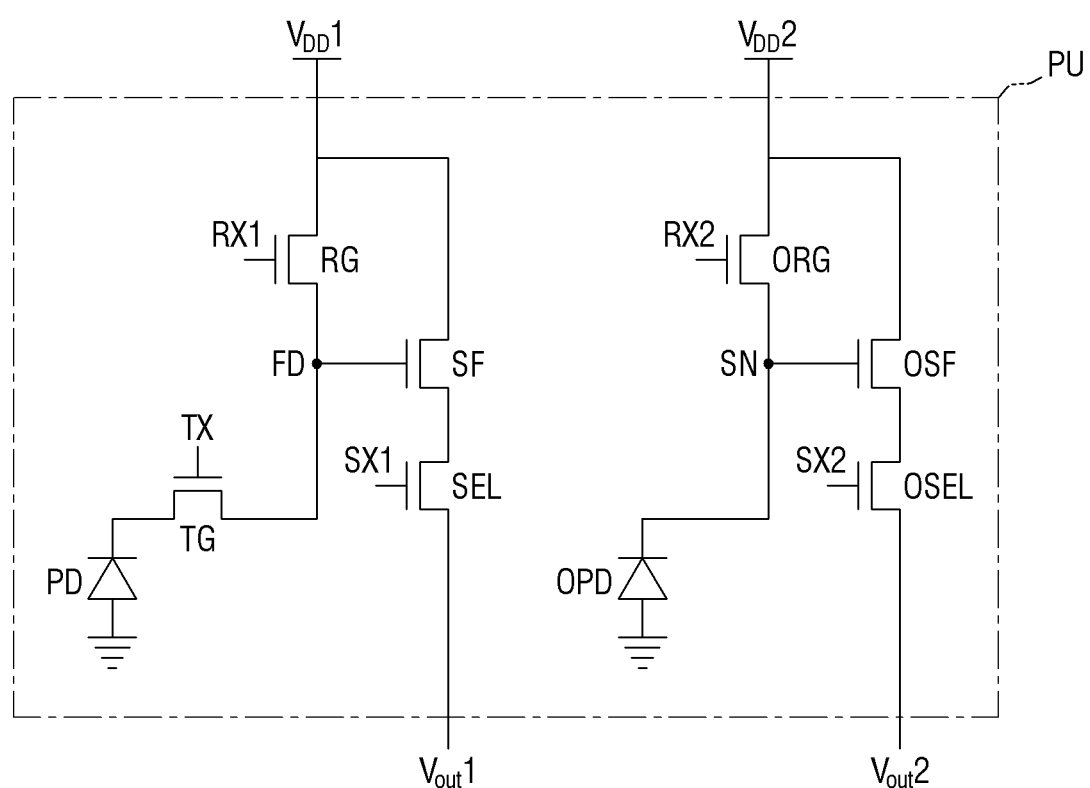
FIG. 2 is an example circuit diagram of a unit pixel region of the image sensor according to some embodiments of inventive concepts.

FIG. 1 is a block diagram of an image sensor according to some embodiments of inventive concepts. FIG. 2 is an example circuit diagram of a unit pixel region of the image sensor according to some embodiments of inventive concepts.

Referring to FIG. 1, an image sensor according to some embodiments includes an active pixel sensor array (APS) 10, a row decoder 20, a row driver 30, a column decoder 40, a timing generator 50, a correlated double sampler (CDS) 60, an analog-to-digital converter (ADS) 70, and an I/O buffer 80.

The active pixel sensor array 10 includes a plurality of unit pixel regions two-dimensionally arranged, and may convert an optical signal into an electric signal. The active pixel sensor array 10 may be driven by a plurality of drive signals such as pixel selection signals, reset signals, and charge transfer signals from the row driver 30. Also, the electrical signal converted by the active pixel sensor array 10 may be provided to a correlated double sampler 60.

The row driver 30 may provide a plurality of drive signals for driving the plurality of unit pixel regions in accordance with the result decoded by the row decoder 20 to the active pixel sensor array 10. When the unit pixel regions are arranged in a matrix form, the drive signal may be provided for each row.

The timing generator 50 may provide a timing signal and a control signal to the row decoder 20 and the column decoder 40.

The correlated double sampler (CDS) 60 may receive, hold and sample the electrical signal generated by the active pixel sensor array 10. The correlated double sampler 60 may doubly sample a specific noise level and a signal level obtained by an electric signal, and may output a difference level corresponding to a difference between the noise level and the signal level.

The analog-to-digital converter ADC (70) may convert and output the analog signal corresponding to the difference level, which is output from the correlated double sampler 60, into a digital signal.

The I/O buffer 80 latches the digital signal, and the latched signal may sequentially output the digital signal to an video signal processing unit (not illustrated) in accordance with the decoding result from the column decoder 40.

Referring to FIG. 2, a unit pixel region PU of an image sensor according to some embodiments may include a first photoelectric conversion element PD, a transfer transistor TG, a floating diffusion region FD, a first reset transistor RG, a first source follower transistor SF, a first selection transistor SEL, a second photoelectric conversion element OPD, a storage node region SN, a second reset transistor ORG, a second source follower transistor OSF, and a second selection transistor OSEL.

The first photoelectric conversion element PD and the second photoelectric conversion element OPD may absorb light and store light corresponding to the amount of light. The first photoelectric conversion element PD and the second photoelectric conversion element OPD may include, for example, a photo diode, a photo transistor, a photo gate, a pinned photo diode, an organic photo diode, a quantum dot, and combinations thereof.

The first photoelectric conversion element PD may be coupled with the transfer transistor TG that transfers the accumulated charge to the floating diffusion region FD. Since the floating diffusion region FD is a region which converts the charge into a voltage and has a parasitic capacitance, charges may be accumulatively stored in the floating diffusion region FD.

One end of the transfer transistor TG may be connected to the first photoelectric conversion element PD, and the other end of the transfer transistor TG may be connected to the floating diffusion region FD. The transfer transistor TG may be made up of a MOS transistor driven by a desired and/or alternatively predetermined bias (e.g., a transfer signal TX). The transfer transistor TG may transfer a first light signal, which is electric charge generated from the first photoelectric conversion element PD, to the floating diffusion region FD in accordance with the transfer signal TX.

The first source follower transistor SF may amplify a change in the electrical potential of the floating diffusion region FD to which the charge accumulated in the first photoelectric conversion element PD is transferred, and may output the change in the electrical potential to a first output line $V_{OUT}1$. When the first source follower transistor SF is turned on, the desired and/or alternatively predetermined electric potential provided to the drain of the first source follower transistor SF, for example, the first power supply voltage $V_{DD}1$ may be transferred to a drain region of the first selection transistor SEL.

The first selection transistor SEL may serve to select unit pixel regions which are read in row units. The first selection transistor SEL may be made up of a MOS transistor driven by a selection line that applies a desired and/or alternatively predetermined bias (e.g., a first row selection signal SX1).

The first reset transistor RG may periodically reset the floating diffusion region FD. The first reset transistor RG may be made up of a MOS transistor driven by a reset line that applies a desired and/or alternatively predetermined bias (e.g., a first reset signal RX1). When the first reset transistor RG is turned on by the first reset signal RX1, a desired and/or alternatively predetermined electric potential provided to the drain of the first reset transistor RG. For example, the first power supply voltage VDD1 may be transferred to the floating diffusion region FD.

The second photoelectric conversion element OPD may be coupled with the storage node region SN. Since the storage node region SN is a region which converts the charge into a voltage and has a parasitic capacitance, charges may be accumulatively stored in the storage node region SN. Although the second photoelectric conversion element OPD is illustrated as not being coupled with the transfer transistor, inventive concepts are not limited thereto. For example, the second photoelectric conversion element OPD may be coupled with a transfer transistor that transfers the accumulated charges.

In some embodiments, the first photoelectric conversion element PD and the second photoelectric conversion element OPD may detect light of wavelengths different from each other. For example, the first photoelectric conversion element PD may detect red light or blue light, and the second photoelectric conversion element OPD may detect green light. In some embodiments, the first photoelectric conversion element PD may include a semiconductor photoelectric conversion element, and the second photoelectric conversion element may include an organic photoelectric conversion element.

The second source follower transistor OSF may amplify the change in the electrical potential of the storage node region SN and output the change to a second output line $V_{OUT}2$. When the second source follower transistor OSF is turned on, the desired and/or alternatively predetermined electric potential provided to the drain of the second source follower transistor OSF, for example, the second power supply voltage $V_{DD}2$ may be transferred to the drain region of the second selection transistor OSEL.

The second selection transistor OSEL may serve to select the unit pixel regions which are read in row units. The second selection transistor OSEL may be made up of a MOS transistor driven by a selection line which applies a desired and/or alternatively predetermined bias (e.g., a second row selection signal SX2).

The second reset transistor ORG may periodically reset the storage node region SN. The second reset transistor ORG may be made up of a MOS transistor driven by a reset line that applies a desired and/or alternatively predetermined bias (e.g., a second reset signal RX2). When the second reset transistor ORG is turned on by the second reset signal RX2, a desired and/or alternatively predetermined electric potential provided to the drain of the second reset transistor ORG, for example, the second power supply voltage $V_{DD}2$ may be transferred to the floating diffusion region FD.

For example, the transfer signal TX, the first selection signal SX1, the first reset signal RX1, the second selection signal SX2 and the second reset signal RX2 may be output, for example, from the row driver 30 of FIG. 1.

Figure 3:
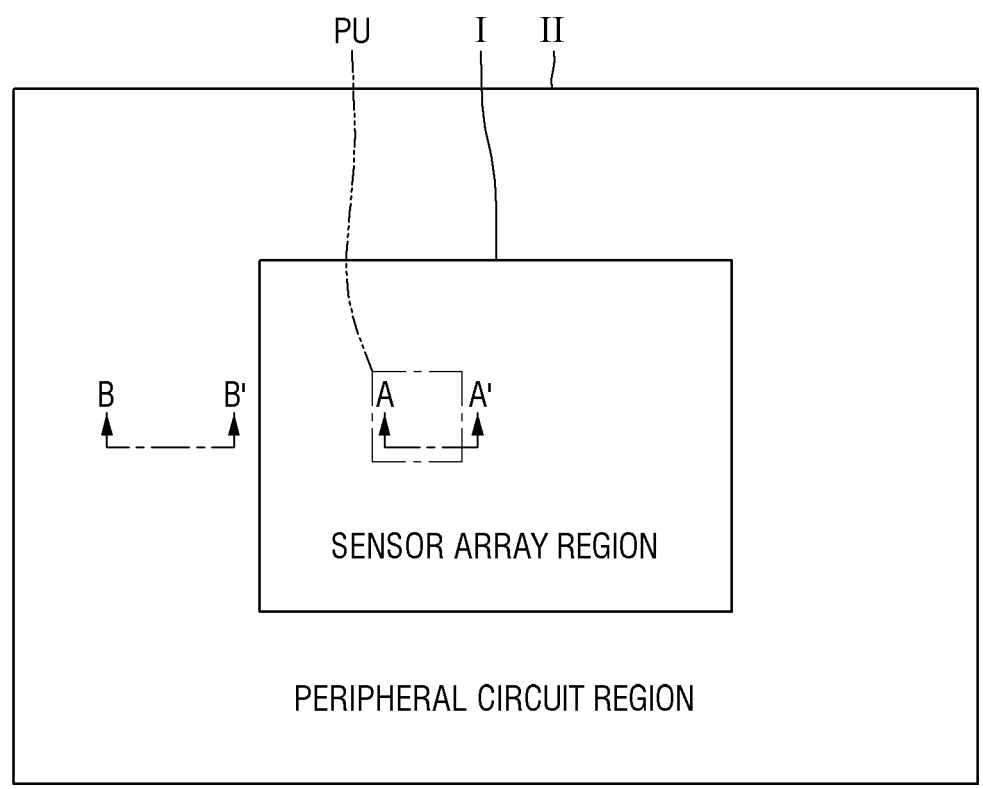
FIG. 3 is a schematic plan view of an image sensor according to some embodiments of inventive concepts.
Figure 4:
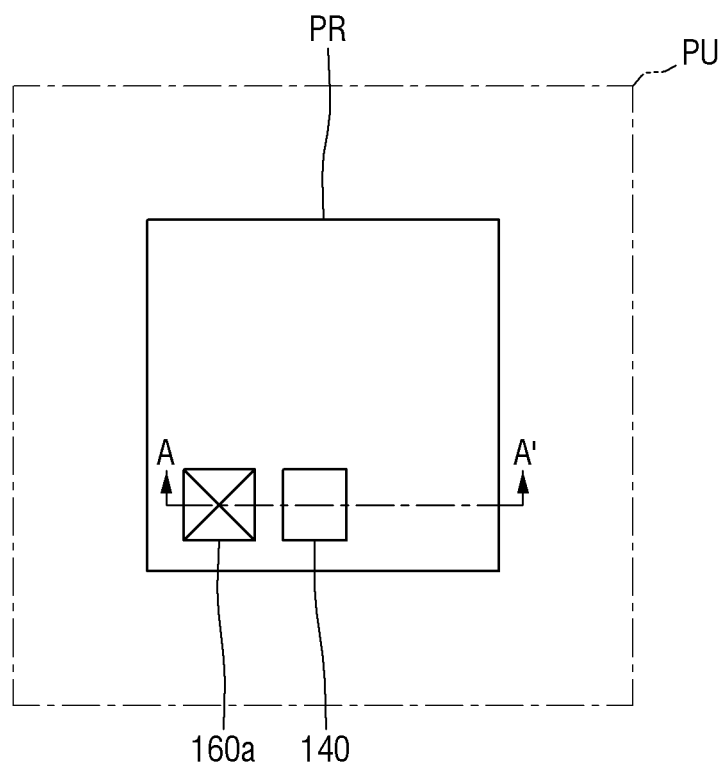
FIG. 4 is a layout view for explaining the unit pixel region PU of FIG. 3.
Figure 5:
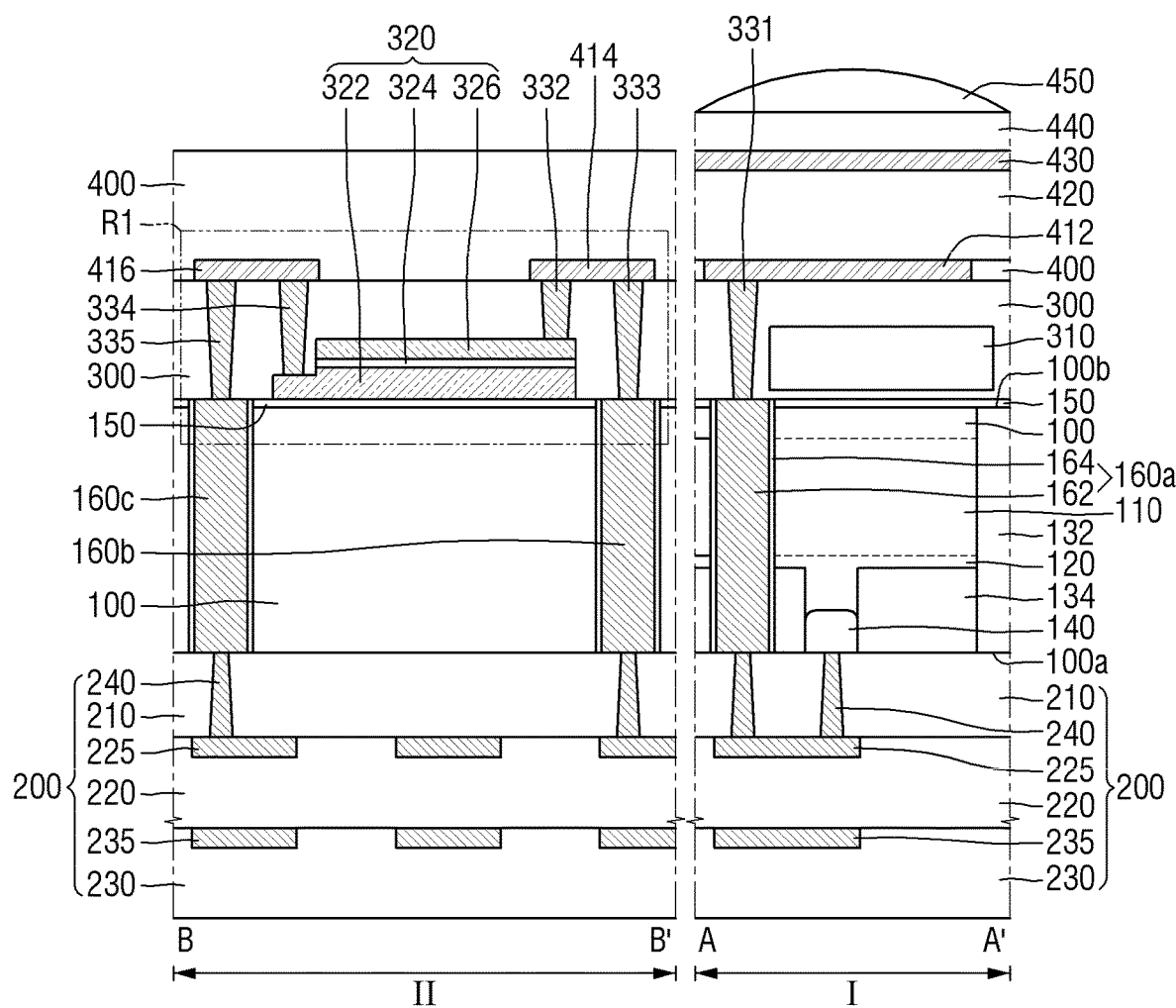
FIG. 5 is a cross-sectional view taken along line A-A' and line B-B' of FIG. 3.
Figure 6:
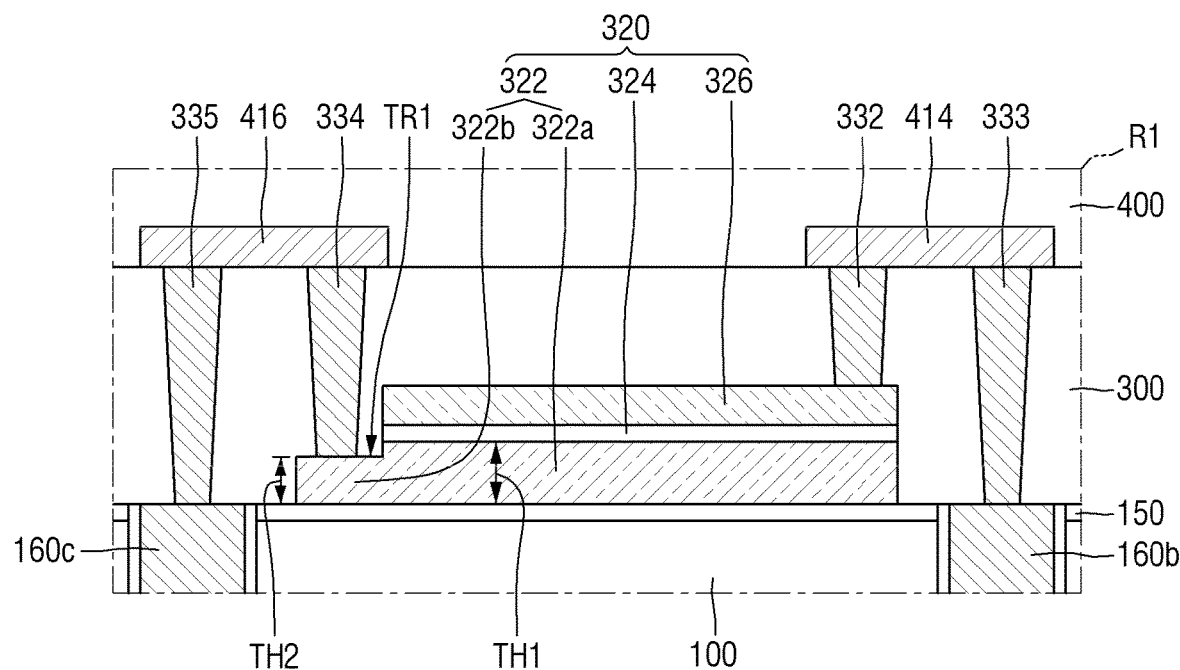
FIG. 6 is an enlarged view of R1 of FIG. 5.

FIG. 3 is a schematic plan view of an image sensor according to some embodiments of inventive concepts. FIG. 4 is a layout view for explaining the unit pixel region PU of FIG. 3. FIG. 5 is a cross-sectional view taken along line A-A' and line B-B' of FIG. 3. FIG. 6 is an enlarged view of R1 of FIG. 5. For the sake of convenience of explanation, repeated parts of the description provided with reference to FIGS. 1 and 2 will be briefly explained or omitted.

Referring to FIGS. 3 and 4, the image sensor according to some embodiments may include a sensor array region I and a peripheral circuit region II. For convenience of explanation, the photoelectric conversion element, the transistor, the contact and the wiring are not illustrated in FIG. 4.

The sensor array region I may be, for example, a region in which the active pixel sensor array 10 of FIG. 1 is formed. The active pixel sensor array 10 of the sensor array region I may include a plurality of unit pixel regions. For example, the active pixel sensor array 10 of the sensor array region I may include the unit pixel region PU of FIG. 2.

The peripheral circuit region II may be, for example, a region in which the correlated double sampler 60, the analog-to-digital converter 70 and the like of FIG. 1 are formed. In FIG. 2, the peripheral circuit region II is illustrated as surrounding the sensor array region I, but inventive concepts are not limited thereto.

The unit pixel region PU may include a unit pixel PR. In FIG. 4, one unit pixel PR is illustrated as being disposed in the unit pixel region PU, but inventive concepts are not limited thereto. For example, a plurality of unit pixels PR may be arranged in the unit pixel region PU.

Referring to FIGS. 3 to 6, an image sensor according to some embodiments includes a substrate 100, a first photoelectric conversion layer 110, a well impurity layer 120, a first element isolation film 132, a second element isolation film 134, a storage node region 140 (e.g., SN of FIG. 2), a wiring structure 200, an anti-reflection film 150, a first interlayer insulating film 300, a color filter 310, a first electrode 412, a second photoelectric conversion layer 420, a second electrode 430, a micro lens 450, a capacitor structure 320, a first wiring 414, and a second interlayer insulating film 400.

The substrate 100 may include a first surface 100*a* and a second surface 100*b* that oppose each other. The second surface 100*b* of the substrate 100 may be a surface on which light is incident. The substrate 100 may be, for example, bulk silicon or silicon-on-insulator (SOI). Alternatively, the substrate 100 may be a silicon substrate or may include other materials, for example, silicon germanium, indium antimonide, lead tellurium compound, indium arsenide, indium phosphide, gallium arsenide or gallium antimonide. Or, the substrate 100 may have an epitaxial layer formed on a base substrate.

The first photoelectric conversion layer 110 may be formed in the substrate 100. The first photoelectric conversion layer 110 may generate photocharge in proportion to the amount of light that is incident from the outside. That is, the first photoelectric conversion layer 110 may receive light and convert the optical signal into an electric signal. The first photoelectric conversion layer 110 may correspond to the first photoelectric conversion element PD of FIG. 2. In some embodiments, the first photoelectric conversion layer 110 may include a semiconductor photoelectric conversion element.

The first photoelectric conversion layer 110 may be formed by doping impurities into the substrate 100. For example, the first photoelectric conversion layer 110 may be formed by implanting n-type impurities into the substrate 100. In addition, the first photoelectric conversion layer 110 may have an impurity concentration difference between the upper portion and the lower portion of the first photoelectric conversion layer 110 to have a potential gradient. For example, the first photoelectric conversion layer 110 may be formed in a form in which a plurality of impurity regions is stacked.

For convenience of explanation, various transistors connected to the first photoelectric conversion layer 110 for processing electric signals are not illustrated. However, a partial region of the substrate 100 may be utilized for disposing various transistors for processing electric signals generated from the first photoelectric conversion layer 110. For example, a part of the unit pixel PR may be utilized to dispose the transfer transistor TG for processing an electric signal generated from the first photoelectric conversion layer 110, a first reset transistor RG, a first source follower transistor SF or a first selection transistor.

The well impurity layer 120 may be formed adjacent to the first photoelectric conversion layer 110. For example, the well impurity layer 120 may be formed in the substrate 100 below the first surface 100*a*. The well impurity layer 120 may be formed by doping an impurity having a conductivity type opposite to that of the first photoelectric conversion layer 110 into the substrate 100. For example, the well impurity layer 120 may be formed by implanting the p-type impurities.

The first element isolation film 132 may define a unit pixel PR in the unit pixel region PU. That is, the unit pixel PR may be defined by the first element isolation film 132. Further, the first element isolation film 132 may be formed to surround the unit pixel PR.

The first element isolation film 132 may be formed by embedding an insulating material in a deep trench formed by patterning the substrate 100. For example, the first element isolation film 132 may be formed to extend from the second surface 100b to the first surface 100a. In accordance with the patterning process, the first element isolation film 132 may have a shape in which the width changes in a direction from the second surface 100b to the first surface 100a.

In some embodiments, the first element isolation film 132 may include an insulating material having a refractive index lower than that of the substrate 100. For example, when the substrate 100 is formed of silicon, the first element isolation film 132 may be formed of a silicon oxide film, a silicon nitride film, an undoped polysilicon film, air and combinations thereof. Thus, the first element isolation film 132 may refract incident light obliquely incident on the first photoelectric conversion layer 110. In addition, the first element isolation film 132 may limit and/or prevent photocharges generated at specific pixels by incident light from moving to adjacent pixel regions due to a random drift. That is, the first element isolation film 132 may improve the light-receiving rate of the first photoelectric conversion layer 110 and improve the quality of the image data.

The second element isolation film 134 may define an active region in the unit pixel PR. For example, the second element isolation film 134 may be formed in the substrate 100 below the first surface 100a. Further, the second element isolation film 134 may be formed in the well impurity layer 120. Thus, the second element isolation film 134 may define the region of the well impurity layer 120, in which the second element isolation film 134 is not formed, as an active region.

For example, the second element isolation film 134 may define an active region such as the storage node region 140 in the well impurity layer 120. The storage node region 140 may be formed by doping an impurity having a conductivity type opposite to that of the well impurity layer 120. For example, the storage node region 140 may be formed by ion implantation of the n-type impurities. The storage node region 140 is connected to the second photoelectric conversion layer 420 and may store the electric signal generated from the second photoelectric conversion layer 420.

The second element isolation film 134 may be formed by embedding an insulating material in a shallow trench formed by patterning the substrate 100. A depth at which the second element isolation film 134 is formed may be shallower than a depth at which the first element isolation film 132 is formed.

The wiring structure 200 may be formed on the first surface 100a of the substrate 100. The wiring structure 200 may include a plurality of insulating layers. For example, the wiring structure 200 may include a first insulating layer 210, a second insulating layer 220 and a third insulating layer 230 sequentially stacked on the first surface 100a of the substrate 100. The first insulating layer 210, the second insulating layer 220, and the third insulating layer 230 may include, for example, at least one of silicon oxide, silicon nitride, silicon oxynitride and a low-k material having a dielectric constant lower than that of silicon oxide.

The wiring structure 200 may include a plurality of wiring layers. For example, the wiring structure 200 may include a first wiring layer 225 formed in the second insulating layer 220, and a second wiring layer 235 formed in the third insulating layer 230.

The anti-reflection film 150 may be formed on the second surface 100b of the substrate 100. The anti-reflection film 150 may limit and/or prevent reflection of light which is incident on the inside of the substrate 100 from the second surface 100b of the substrate 100. In some embodiments, the anti-reflection film 150 may be formed on both the substrate 100 of the sensor array region I and the substrate 100 of the peripheral circuit region II.

The anti-reflection film 150 is illustrated as being conformally formed along the second surface 100b of the substrate 100, but inventive concepts are not limited thereto. For example, the anti-reflection film 150 may be formed in a form of wrapping a lower surface and a side wall of the color filter 310. In addition, although the anti-reflection film 150 is illustrated as being a single film, it may be formed of multiple films. In some embodiments, the anti-reflection film 150 may be omitted.

The first interlayer insulating film 300 may be formed on the second surface 100b of the substrate 100. For example, the first interlayer insulating film 300 may be formed to cover the upper surface of the anti-reflection film 150. The first interlayer insulating film 300 may be formed on both the substrate 100 of the sensor array region I and the substrate 100 of the peripheral circuit region II.

The first interlayer insulating film 300 may include at least one of silicon oxide, silicon nitride, silicon oxynitride and a low-k material having dielectric constant lower than silicon oxide. The low-k material may include, but is not limited to, for example, at least one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

The color filter 310 may be formed on the second surface 100b of the substrate 100 of the sensor array region I. The color filter 310 may be formed in the first interlayer insulating film 300. For example, the first interlayer insulating film 300 of the sensor array region I may cover the color filter 310.

In some embodiments, the color filter 310 may include a color filter of either a red filter or a blue filter. However, inventive concepts are not limited thereto, and the color filter 310 may include one color filter among a green filter, a yellow filter, a magenta filter, a cyan filter or a white filter.

A first electrode 412 may be formed on the first interlayer insulating film 300 of the sensor array region I. For example, the first electrode 412 may extend along a part of the upper surface of the first interlayer insulating film 300 of the sensor array region I.

The first electrode 412 may include a transparent conductive material. For example, the first electrode 412 may be include at least one of ITO (Indium Tin Oxide), ZnO (Zinc Oxide), SnO2 (Tin Dioxide), ATO (Antimony-doped Tin Oxide), AZO (Aluminum-doped Zinc Oxide), GZO (Gallium-doped Zinc Oxide), TiO$_2$ (Titanium Dioxide), FTO (Fluorine-doped Tin Oxide), and combinations thereof. Hereinafter, the first electrode 412 is illustrated as including ITO.

The second photoelectric conversion layer 420 may be formed on the first electrode 412. For example, the second photoelectric conversion layer 420 may extend along the upper surface of the first electrode 412. The second photoelectric conversion layer 420 may generate photocharge in proportion to the amount of light incident from the outside. That is, the second photoelectric conversion layer 420 may receive light and may convert the optical signal into an electric signal. The second photoelectric conversion layer 420 may correspond to the second photoelectric conversion element OPD of FIG. 2. In some embodiments, the second photoelectric conversion layer 420 may include an organic photoelectric conversion element.

Although the second photoelectric conversion layer 420 is illustrated as extending to be longer than the first electrode 412, but inventive concepts are not limited thereto. For example, the second photoelectric conversion layer 420 may extend only along the upper surface of the first electrode 412 as necessary.

In some embodiments, the second photoelectric conversion layer 420 may detect green light. For example, light having a green wavelength among light incident from the outside may be absorbed by the second photoelectric conversion layer 420. Accordingly, the second photoelectric conversion layer 420 may provide an electric signal of green light. Light of other wavelengths except the green light may pass through the second photoelectric conversion layer 420.

Also, in some embodiments, the first photoelectric conversion layer 110 may detect red or blue light. For example, the light that has passed through the second photoelectric conversion layer 420 passes through the color filter 310 and may provide red light or blue light to the first photoelectric conversion layer 110. Accordingly, the first photoelectric conversion layer 110 may provide an electric signal of red light or blue light.

The second electrode 430 may be formed on the second photoelectric conversion layer 420. For example, the second electrode 430 may extend along the upper surface of the second photoelectric conversion layer 420. Accordingly, the second photoelectric conversion layer 420 may be interposed between the first electrode 412 and the second electrode 430. Different levels of voltage may be applied to the first electrode 412 and the second electrode 430. For example, voltage of different levels from each other may be applied to the first electrode 412 and the second electrode 430 such that the electric signal generated from the second photoelectric conversion layer 420 faces the second electrode.

Although the second electrode 430 is illustrated as extending to be longer than the first electrode 412, inventive concepts are not limited thereto. For example, if desired, the second electrode 430 may also extend only along the upper surface of the first electrode 412.

The second electrode 430 may include a transparent conductive material. For example, the second electrode 430 may include at least one of ITO (Iridium Tin Oxide), ZnO (Zinc Oxide), SnO2 (Tin Dioxide), ATO (Antimony-doped Tin Oxide), AZO (Aluminum-doped Zinc Oxide), GZO (Gallium-doped Zinc Oxide), $TiO_2$ (Titanium Dioxide), FTO (Fluorine-doped Tin Oxide), and combinations thereof. The second electrode 430 may include the same material as the first electrode 412, or may include materials different from the first electrode 412. Hereinafter, the second electrode 430 is illustrated as including ITO.

The micro lens 450 may be formed on the second electrode 430. The micro lens 450 has a convex shape and may have a desired and/or alternatively predetermined radius of curvature. Accordingly, the micro lens 450 may condense the light incident on the sensor array region I.

The micro lens 450 may include, but is not limited to, for example an organic material such as a light-transmitting resin.

The image sensor according to some embodiments may further include a protective layer 440 interposed between the second electrode 430 and the micro lens 450. The protective layer 440 may include a transparent insulating material. The protective layer 440 may include, for example, silicon oxide or metal oxide.

The image sensor according to some embodiments may further include a first penetration via 160a in the substrate 100 of the sensor array region I.

The first penetration via 160a may penetrate the substrate 100 and electrically connect the first electrode 412 and the storage node region 140. For example, the first penetration via 160a may be electrically connected to the first electrode 412 through the first contact 331 penetrating the first interlayer insulating film 300. Further, for example, the first penetration via 160a may be electrically connected to the storage node region 140 in the substrate 100 through the second contact 240 penetrating the first insulating layer 210 and the first wiring layer 225 in the second insulating layer 220. Accordingly, the electric signal generated from the second photoelectric conversion layer 420 may be stored in the storage node region 140.

In some embodiments, a width of the first contact 331 may increase as the first contact 331 is away from the second surface 100b of the substrate 100. Also, in some embodiments, the width of the second contact 240 may increase as the second contact 240 is away from the first surface 100a of the substrate 100. This may be attributed, for example, to characteristics of an etching process for forming the first contact 331 and the second contact 240.

In FIG. 5, the first penetration via 160a is illustrated as penetrating the anti-reflection film 150, but inventive concepts are not limited thereto. For example, the anti-reflection film 150 may cover a part of the upper surface of the first penetration via 160a, and the first contact 331 penetrates the anti-reflection film 150 and may be connected to the first penetration via 160a.

In some embodiments, the first penetration via 160a may include a penetration conductor 162 and a penetration insulator 164. The penetration conductor 162 of the first penetration via 160a penetrates the substrate 100 and may extend from the first surface 100a to the second surface 100b. The penetration insulator 164 of the first penetration via 160a may cover the side wall of the penetration conductor 162 to insulate the substrate 100 from the penetration conductor 162.

The capacitor structure 320 may be formed on the second surface 100b of the substrate 100. The capacitor structure 320 may be formed in the first interlayer insulating film 300. For example, the first interlayer insulating film 300 may cover the capacitor structure 320.

In some embodiments, the capacitor structure 320 may be formed in the first interlayer insulating film 300 of the peripheral circuit region II. However, inventive concepts are not limited thereto, and the capacitor structure 320 may be formed in the first interlayer insulating film 300 of the sensor array region I.

The capacitor structure 320 may include a first conductive pattern 322, a dielectric pattern 324 and a second conductive pattern 326 sequentially stacked on the second surface 100*b* of the substrate 100. Voltages of different levels from each other may be applied to the first conductive pattern 322 and the second conductive pattern 326. The capacitor structure 320 may store electric charge in the dielectric pattern 324, using a potential difference generated between the first conductive pattern 322 and the second conductive pattern 326.

The first conductive pattern 322 may be formed on the second surface 100*b* of the substrate 100. For example, the first conductive pattern 322 may extend along the upper surface of the anti-reflection film 150. The first conductive pattern 322 may include, but is not limited to, for example, tungsten (W).

The dielectric pattern 324 may be formed on the first conductive pattern 322. The dielectric pattern 324 may extend, for example, along the upper surface of the first conductive pattern 322. The dielectric pattern 324 may include, but is not limited to, at least one of, for example, silicon nitride, silicon oxide, and combinations thereof. For example, the dielectric pattern 324 may also include a high-k material having a dielectric constant higher than that of silicon oxide.

The second conductive pattern 326 may be formed on the dielectric pattern 324. The second conductive pattern 326 may extend, for example, along the upper surface of the dielectric pattern 324. Thus, the dielectric pattern 324 may be interposed between the first conductive pattern 322 and the second conductive pattern 326. The second conductive pattern 326 may include, for example, titanium nitride (TiN), but is not limited thereto.

In some embodiments, the dielectric pattern 324 and the second conductive pattern 326 may expose a part of the upper surface of the first conductive pattern 322. For example, as illustrated in FIG. 6, the capacitor structure 320 may include a first trench TR1 which exposes a part of the upper surface of the first conductive pattern 322. In some embodiments, the first trench TR1 may be formed at one end of the capacitor structure 320.

Thus, the first conductive pattern 322 may include a first portion 322*a* which overlaps the second conductive pattern 326, and a second portion 322*b* which does not overlap the second conductive pattern 326. Here, the term 'overlap' means an overlap in a direction perpendicular to the second surface 100*b* of the substrate 100. In some embodiments, the first portion 322*a* of the first conductive pattern 322 may overlap the dielectric pattern 324, and the second portion 322*b* of the first conductive pattern 322 may not overlap the dielectric pattern 324.

In some embodiments, a first thickness TH1 of the first portion 322*a* of the first conductive pattern 322 may be different from a second thickness TH2 of the second portion 322*b* of the first conductive pattern 322. For example, the second thickness TH2 may be smaller than the first thickness TH1. This may be attributed to the characteristics of the etching process for forming the first trench TR1. This will be described later in detail with reference to FIG. 18.

A first wiring 414 may be formed on the first interlayer insulating film 300. The first wiring 414 may be spaced apart from the first electrode 412. For example, the first electrode 412 may extend along a part of the upper surface of the first interlayer insulating film 300 of the peripheral circuit region II.

The first wiring 414 may be connected to the second conductive pattern 326 of the capacitor structure 320. For example, the first wiring 414 may be electrically connected to the second conductive pattern 326 through a third contact 332 penetrating the first interlayer insulating film 300.

The image sensor according to some embodiments may further include a second penetration via 160*b* in the substrate 100. The second penetration via 160*b* may be formed, for example, in the substrate 100 of the peripheral circuit region II.

The second penetration via 160*b* penetrates the substrate 100 and may electrically connect the first wiring 414 and the wiring structure 200. For example, the second penetration via 160*b* may be electrically connected to the wiring structure 200 through a fourth contact 333 penetrating the first interlayer insulating film 300. Thus, the second conductive pattern 326 may be electrically connected to circuit elements and the like on the first surface 100*a* of the sensor array region I.

In some embodiments, the first wiring 414 may be formed at the same level as the first electrode 412. In the present specification, the expression "formed at the same level" means formation provided by the same fabricating process. For example, a material configuration of the first wiring 414 and a material configuration of the first electrode 412 may be substantially the same. For example, the first wiring 414 may include substantially the same ITO as the first electrode 412. Also, in some embodiments, the thickness of the first wiring 414 may be substantially the same as the thickness of the first electrode 412.

The image sensor according to some embodiments may further include a second wiring 416 formed on the first interlayer insulating film 300. The second wiring 416 may be spaced apart from the first electrode 412 and the first wiring 414. For example, the second wiring 416 may extend along another part of the upper surface of the first interlayer insulating film 300 in the peripheral circuit region II.

The second wiring 416 may be connected to the first conductive pattern 322 of the capacitor structure 320. For example, the second wiring 416 may be electrically connected to the first conductive pattern 322 through a fifth contact 334 passing through the first interlayer insulating film 300. In some embodiments, the fifth contact 334 may be electrically connected to the second portion 322*b* of the first conductive pattern 322.

The image sensor according to some embodiments may further include a third penetration via 160*c* in the substrate 100. The third penetration via 160*c* may be formed, for example, in the substrate 100 of the peripheral circuit region II. The third penetration via 160*c* may be spaced apart from the second penetration via 160*b*.

The third penetration via 160*c* penetrates the substrate 100 and may electrically connect the second wiring 416 and the wiring structure 200. For example, the third penetration via 160*c* may be electrically connected to the wiring structure 200 through a sixth contact 335 penetrating the first interlayer insulating film 300. Thus, the first conductive pattern 322 may be electrically connected to circuit elements and the like on the first surface 100*a* of the sensor array region I.

In some embodiments, the second wiring 416 may be formed at the same level as the first electrode 412 and the first wiring 414. For example, a material configuration of the second wiring 416, a material configuration of the first electrode 412, and a material configuration of the first wiring 414 may be substantially the same. For example, the second wiring 416 may include ITO that is substantially the same as that of the first electrode 412 and the first wiring 414. Also, in some embodiments, a thickness of the second wiring 416 may be substantially the same as a thickness of the first electrode 412 and a thickness of the first wiring 414.

In some embodiments, the widths of the third to sixth contacts 332, 333, 334, 335 may increase as the third to sixth contacts are away from the second surface 100*b* of the substrate 100. This may be attributed, for example, to the characteristics of the etching process for forming the third to sixth contacts 332, 333, 334, 335.

The second interlayer insulating film 400 may be formed on the first interlayer insulating film 300. The second interlayer insulating film 400 may be formed to cover the first wiring 414 and the second wiring 416. In some embodiments, the upper surface of the second interlayer insulating film 400 may be disposed on substantially the same plane as the upper surface of the second electrode 430.

The second interlayer insulating film 400 may include the same material as the first interlayer insulating film 300, or may include a material different from the first interlayer insulating film 300.

The image sensor according to some embodiments may implement a large-capacity capacitor, using the capacitor structure 320 disposed on the second surface 100*b* of the substrate 100 on which light is incident. In addition, since the capacitor structure 320 may be formed in an empty space of the sensor array region I and the peripheral circuit region II, the degree of integration of the image sensor according to some embodiments can be improved.

Figure 7:
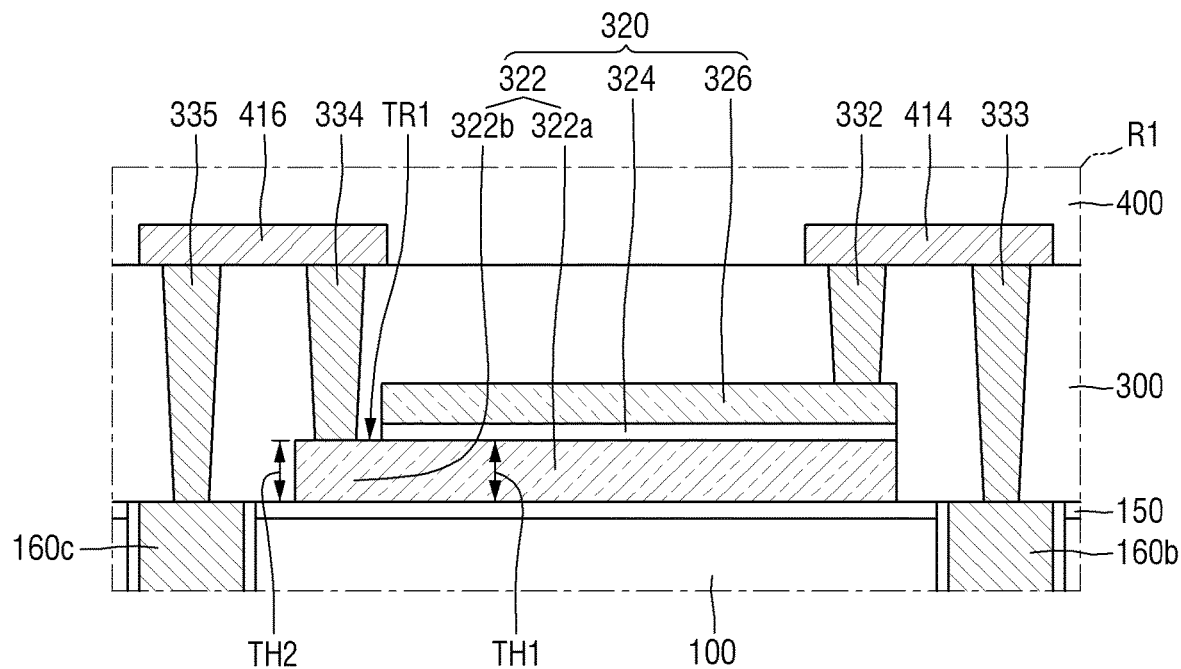
FIG. 7 is a view for explaining the image sensor according to some embodiments of inventive concepts.

FIG. 7 is a view for explaining the image sensor according to some embodiments of inventive concepts. For the sake of convenience of explanation, repeated parts of the description provided with reference to FIGS. 1 to 6 will be briefly described or omitted.

Referring to FIG. 7, in the image sensor according to some embodiments, a first thickness TH1 of a first portion 322*a* of a first conductive pattern 322 is substantially the same as a second thickness TH2 of a second portion 322*b* of the first conductive pattern 322.

For example, in the process of forming the first trench TR1, the second conductive pattern 326 and the dielectric pattern 324 may be etched, but the first conductive pattern 322 may not be etched.

Figure 8:
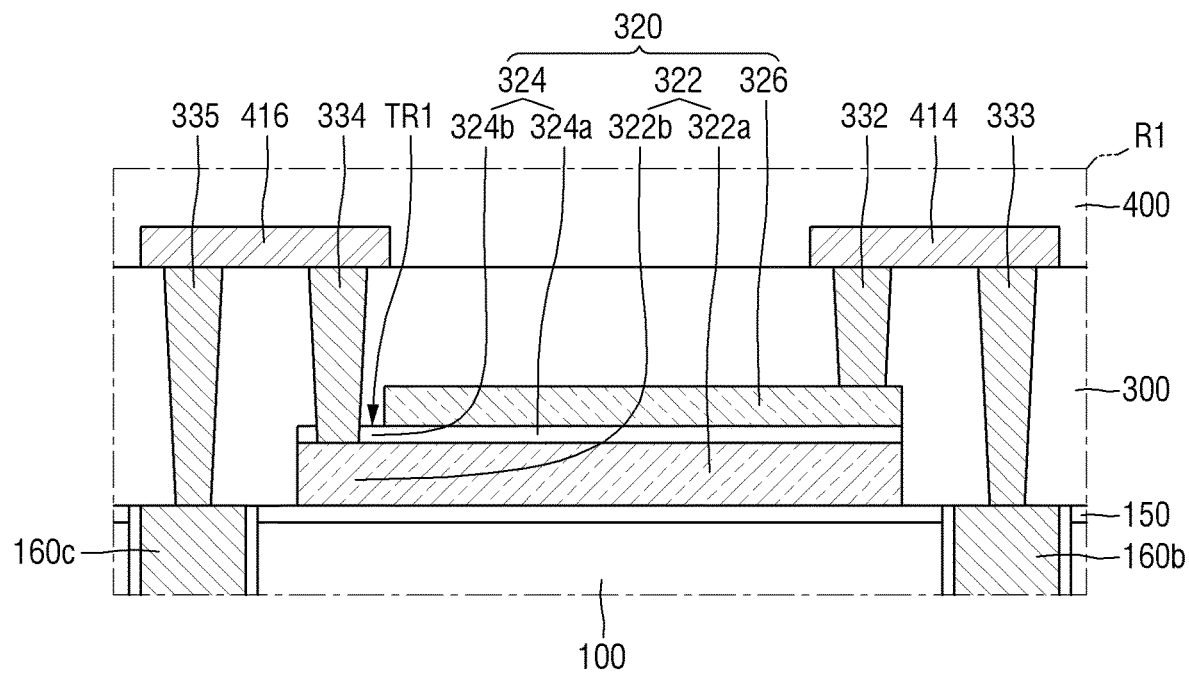
FIG. 8 is a view for explaining an image sensor according to some embodiments of inventive concepts.

FIG. 8 is a view for explaining an image sensor according to some embodiments of inventive concepts. For the sake of convenience of explanation, repeated parts of the description provided with reference to FIGS. 1 to 6 will be briefly described or omitted.

Referring to FIG. 8, in the image sensor according to some embodiments, the second conductive pattern 326 exposes a part of the upper surface of the dielectric pattern 324.

For example, the first trench TR1 may expose a part of the upper surface of the dielectric pattern 324. Thus, the dielectric pattern 324 may include a third portion 324*a* which overlaps the second conductive pattern 326, and a fourth portion 324*b* which does not overlap the second conductive pattern 326. Here, the term 'overlap' means an overlap in a direction perpendicular to the second surface 100*b* of the substrate 100. In some embodiments, the second portion 322*b* of the first conductive pattern 322 may overlap the fourth portion 324*b* of the dielectric pattern 324.

In some embodiments, the fifth contact 334 penetrates the first interlayer insulating film 300 and the dielectric pattern 324 and may electrically connect the second portion 322*b* of the first conductive pattern 322 and the second wiring 416.

Figure 9:
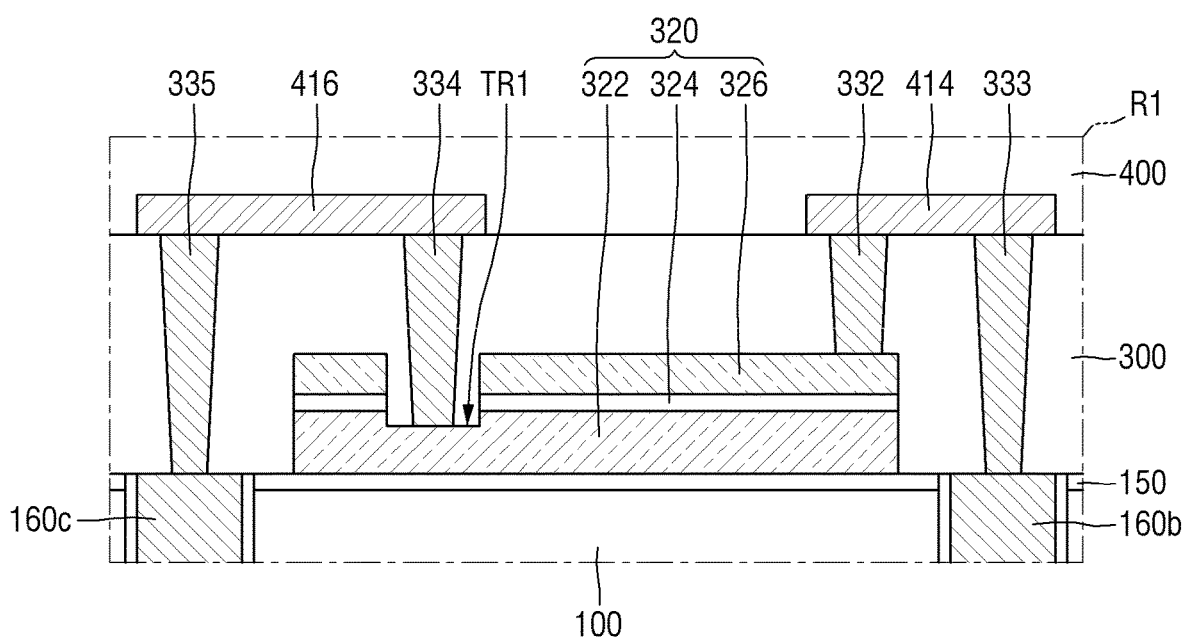
FIG. 9 is a view for explaining an image sensor according to some embodiments of inventive concepts.

FIG. 9 is a view for explaining an image sensor according to some embodiments of inventive concepts. For the sake of convenience of explanation, repeated parts of the description provided with reference to FIGS. 1 to 6 will be briefly described or omitted.

Referring to FIG. 9, in the image sensor according to some embodiments, a first trench TR1 may be formed in a central part of the capacitor structure 320.

For example, the first trench TR1 may expose a part of the upper surface of the central part of the first conductive pattern 322. In some embodiments, the fifth contact 334 may be connected to a part of the upper surface of the central part of the first conductive pattern 322 exposed by the first trench TR1.

Figure 10:
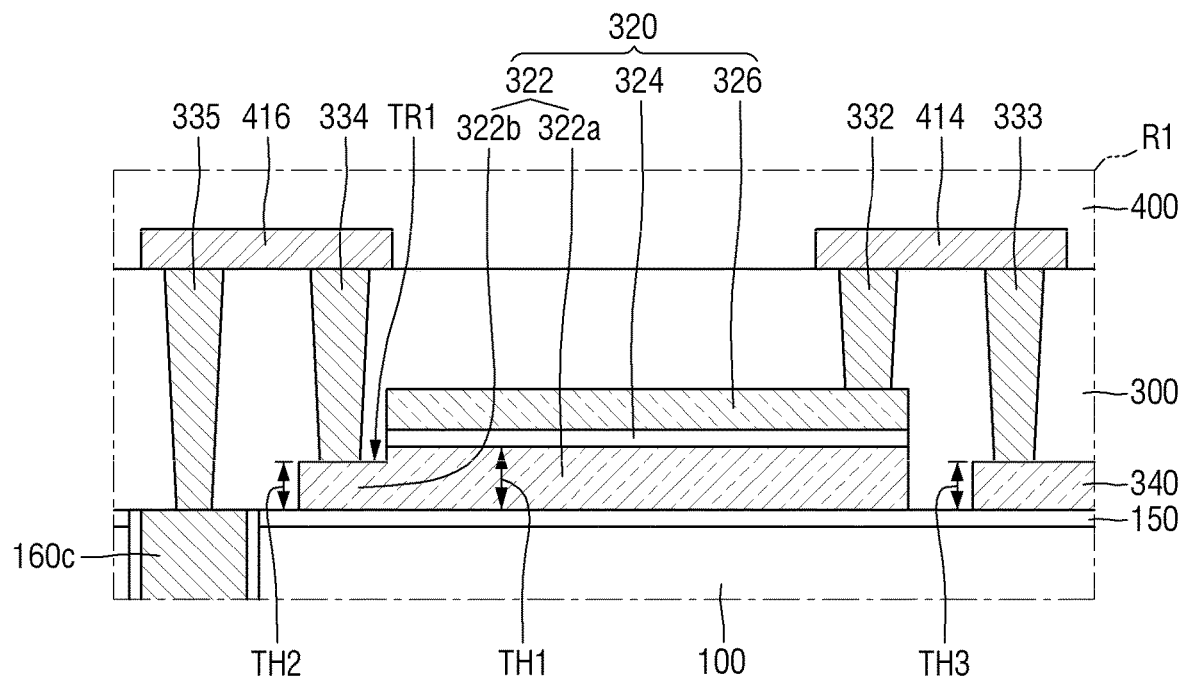
FIG. 10 is a view for explaining an image sensor according to some embodiments of inventive concepts.

FIG. 10 is a view for explaining an image sensor according to some embodiments of inventive concepts. For the sake of convenience of explanation, repeated parts of the description provided with reference to FIGS. 1 to 6 will be briefly described or omitted.

Referring to FIG. 10, the image sensor according to some embodiments further includes a third conductive pattern 340.

The third conductive pattern 340 may be formed on the second surface 100*b* of the substrate 100. The third conductive pattern 340 may extend, for example, along the upper surface of the anti-reflection film 150. The third conductive pattern 340 may be spaced apart from the first conductive pattern 322.

The third conductive pattern 340 may extend long along the second surface 100*b* of the substrate 100. In some embodiments, the third conductive pattern 340 may extend from the peripheral circuit region II to the sensor array region I along the second surface 100*b* of the substrate 100. Thus, the second conductive pattern 326 may be electrically connected to circuit elements and the like on the second surface 100*b* of the substrate 100.

In some embodiments, the third conductive pattern 340 may be formed at the same level as the first conductive pattern 322. For example, a material configuration of the third conductive pattern 340 may be substantially the same as a material configuration of the first conductive pattern 322. For example, the third conductive pattern 340 may include substantially the same tungsten (W) as the first conductive pattern 322.

In some embodiments, the third thickness TH3 of the third conductive pattern 340 may be different from the first thickness TH1 of the first portion 322*a* of the first conductive pattern 322. For example, the third thickness TH3 may be smaller than the first thickness TH1.

In some embodiments, the third thickness TH3 may be substantially the same as the second thickness TH2. For example, the third conductive pattern 340 may be formed at the same level as the second portion 322*b* of the first conductive pattern 322.

Figure 11:
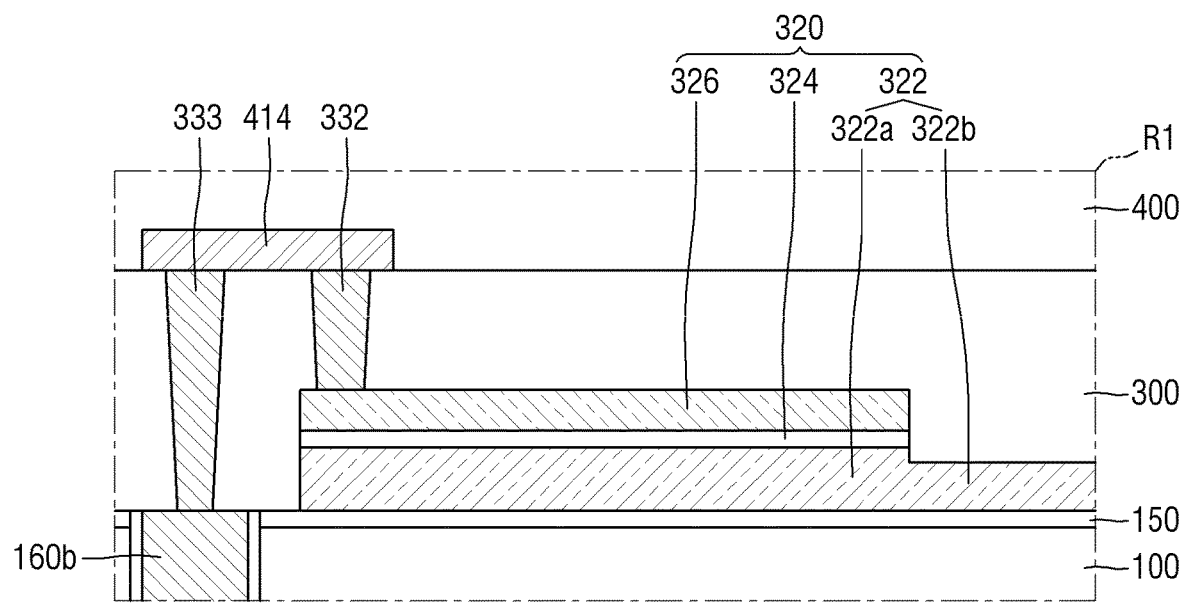
FIG. 11 is a diagram for explaining an image sensor according to some embodiments of inventive concepts.

FIG. 11 is a diagram for explaining an image sensor according to some embodiments of inventive concepts. For the sake of convenience of explanation, repeated parts of the description provided with reference to FIGS. 1 to 6 will be briefly described or omitted.

Referring to FIG. 11, in the image sensor according to some embodiments, the first conductive pattern 322 extends long along the second surface 100*b* of the substrate 100.

For example, the first conductive pattern 322 is not connected to the second wiring (416 of FIG. 6) but may extend long along the second surface 100*b* of the substrate 100. In some embodiments, the second portion 322*b* of the first conductive pattern 322 may extend from the peripheral circuit region II to the sensor array region I. As a result, the first conductive pattern 322 may be electrically connected to circuit elements and the like on the second surface 100b of the substrate 100.

Figure 12:
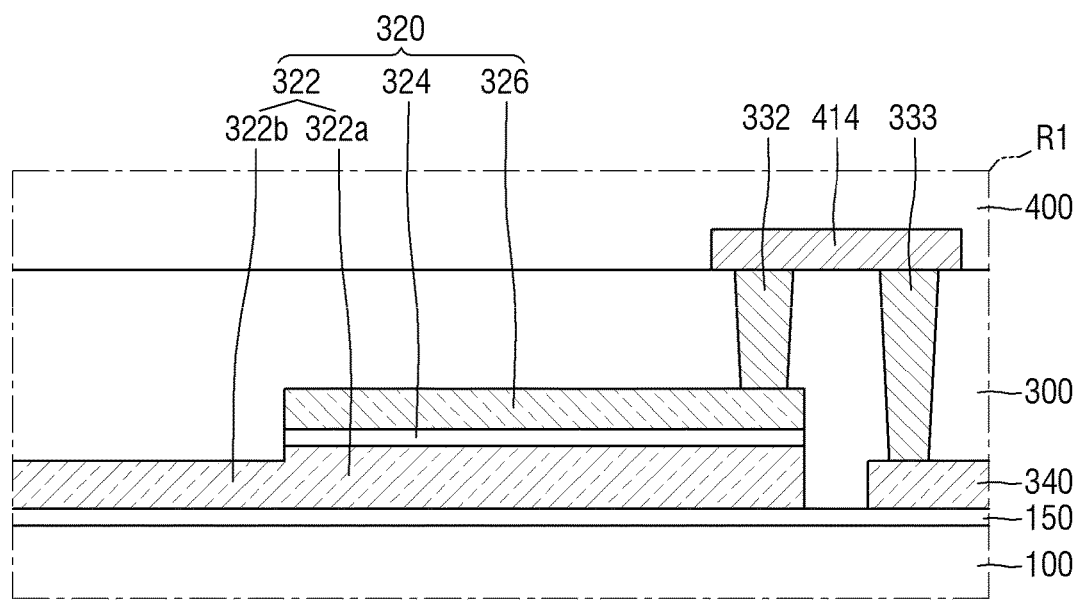
FIG. 12 is a diagram illustrating an image sensor according to some embodiments of inventive concepts.

FIG. 12 is a diagram illustrating an image sensor according to some embodiments of inventive concepts. For the sake of convenience of explanation, repeated parts of the description provided with reference to FIGS. 1 to 6, 10 and 11 will be briefly explained or omitted.

Referring to FIG. 12, in the image sensor according to some embodiments, the first conductive pattern 322 and the third conductive pattern 340 extend long along the second surface 100b of the substrate 100.

Although the first conductive pattern 322 is illustrated as extending in a direction away from the sensor array region I, but inventive concepts are not limited thereto. For example, the first conductive pattern 322 may extend from the peripheral circuit region II to the sensor array region I. Thus, the first conductive pattern 322 and the third conductive pattern 340 may be electrically connected to a circuit element or the like on the second surface 100b of the substrate 100.

Figure 13:
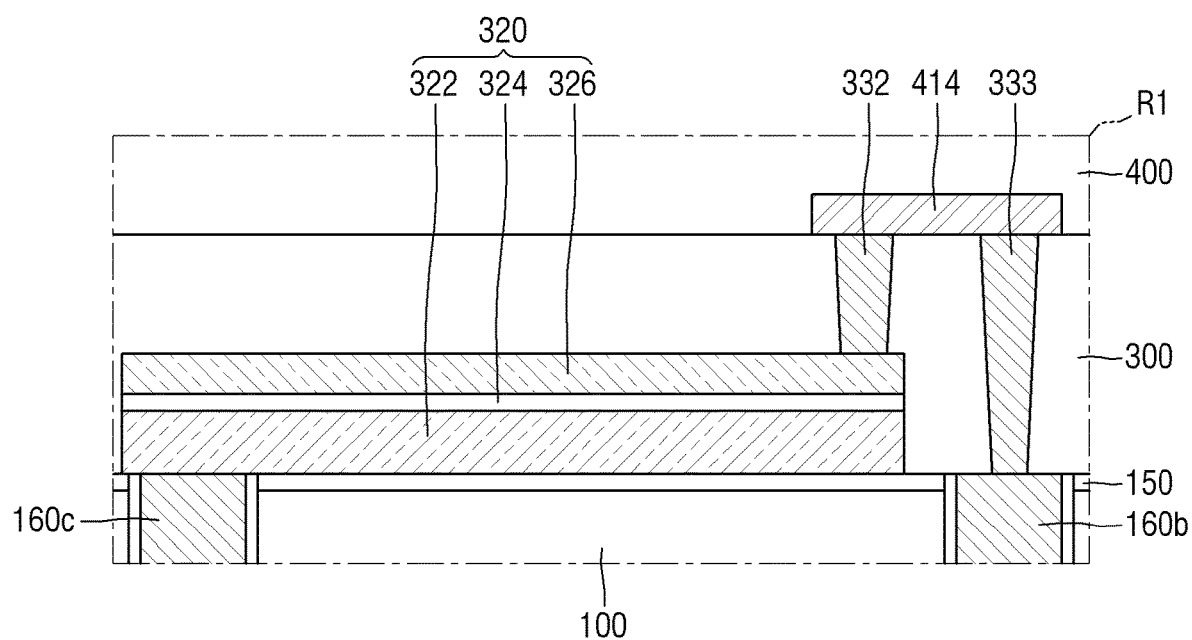
FIG. 13 is a view for explaining an image sensor according to some embodiments of inventive concepts.

FIG. 13 is a view for explaining an image sensor according to some embodiments of inventive concepts. For the sake of convenience of explanation, repeated parts of the description provided with reference to FIGS. 1 to 6 will be briefly described or omitted.

Referring to FIG. 13, in the image sensor according to some embodiments, a first conductive pattern 322 is directly connected to a third penetration via 160c.

For example, a part of the bottom surface of the first conductive pattern 322 may be in direct contact with a part of the upper surface of the third penetration via 160c. Thus, the first conductive pattern 322 may be electrically connected to circuit elements and the like on the first surface 100a of the substrate 100.

Figure 14:
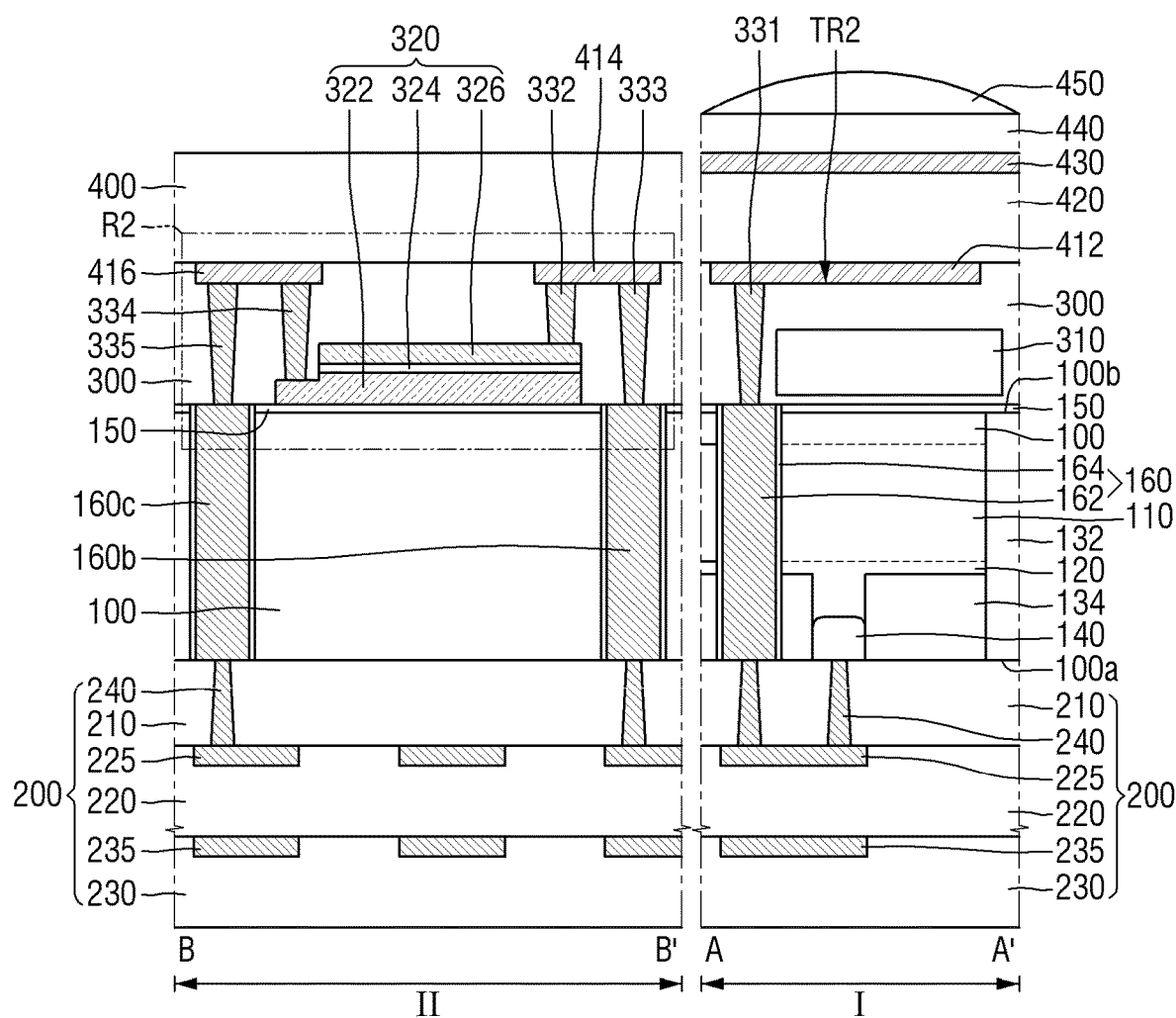
FIG. 14 is a view for explaining an image sensor according to some embodiments of inventive concepts.
Figure 15:
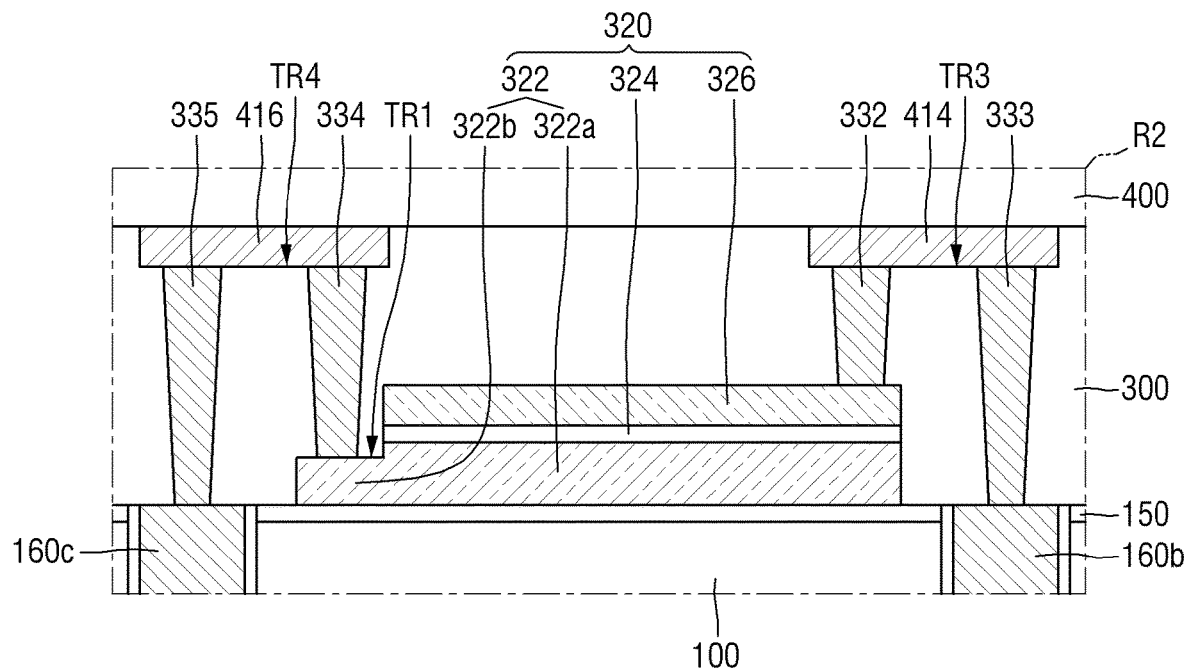
FIG. 15 is an enlarged view of R2 of FIG. 14.

FIG. 14 is a view for explaining an image sensor according to some embodiments of inventive concepts. FIG. 15 is an enlarged view of R2 of FIG. 14. For the sake of convenience of explanation, repeated parts of the description provided with reference to FIGS. 1 to 6 will be briefly described or omitted.

Referring to FIGS. 14 and 15, the first electrode 412 fills the second trench TR2, the first wiring 414 fills the third trench TR3, and the second wiring 416 fills the fourth trench TR4.

The second to fourth trenches TR2, TR3, TR4 may be formed in the first interlayer insulating film 300. The second trench TR2 may be formed in the first interlayer insulating film 300 of the sensor array region I. In some embodiments, the third trench TR3 and the fourth trench TR4 may be formed in the first interlayer insulating film 300 of the peripheral circuit region II.

In some embodiments, second to fourth trenches TR2, TR3, TR4 may be formed at the same level. For example, the depths of the second to fourth trenches TR2, TR3, TR4 may be substantially the same.

In some embodiments, the upper surface of the first electrode 412, the upper surface of the first wiring 414 and the upper surface of the second wiring 416 may be arranged on substantially the same plane as the uppermost surface of the first interlayer insulating film 300. For example, after a conductive film that fills the second to fourth trenches TR2, TR3, TR4 is formed, a planarization process is performed, and the first electrode 412, the first wiring 414 and the second wiring 416 may be formed.

FIGS. 16 to 23 are intermediate stage diagrams for explaining a method for fabricating an image sensor according to some embodiments of inventive concepts. For the sake of convenience of explanation, repeated parts of the description provided with reference to FIGS. 1 to 15 will be briefly described or omitted.

Figure 16:
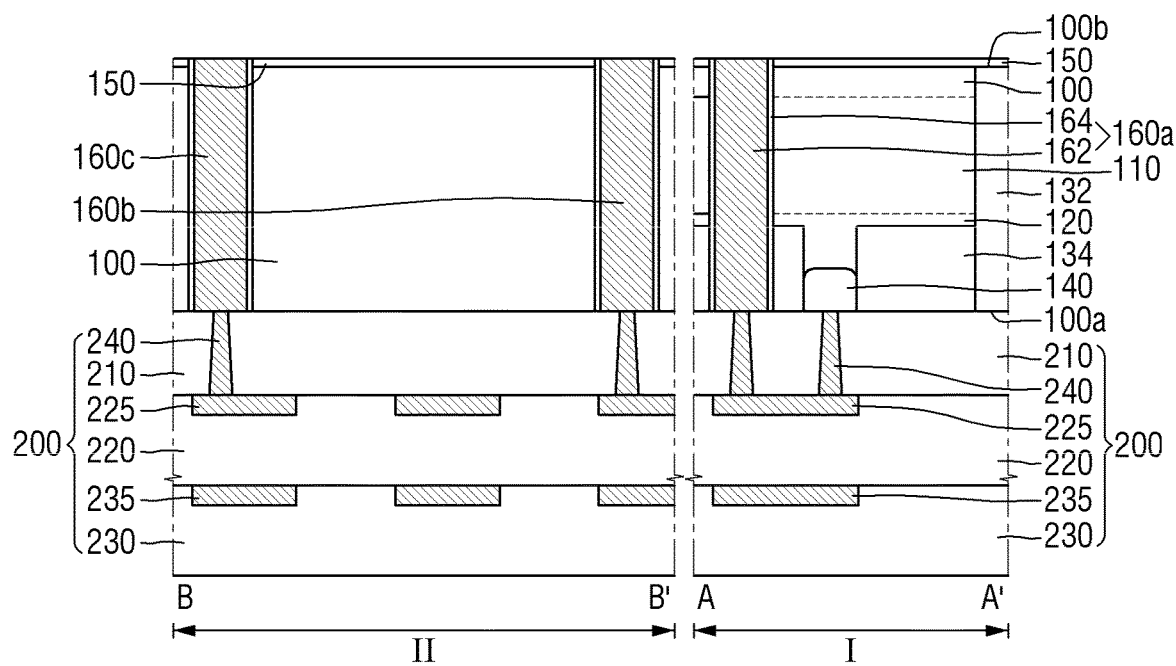
FIGS. 16 to 23 are intermediate stage diagrams for explaining a method for fabricating an image sensor according to some embodiments of inventive concepts.

Referring to FIG. 16, a wiring structure 200 is formed on the first surface 100a of the substrate 100.

First, the substrate 100 on which the first photoelectric conversion layer 110, the well impurity layer 120, a first element isolation film 132 and a second element isolation film 134 are formed may be provided. In some embodiments, the first penetration via 160a, the second penetration via 160b and the third penetration via 160c may be formed in the substrate 100.

Subsequently, the wiring structure 200 may be formed on the first surface 100a of the substrate 100. In some embodiments, the wiring structure 200 may include a plurality of insulating layers 210, 220, 230, a plurality of wirings 225, 235 and a second contact 240.

Figure 17:
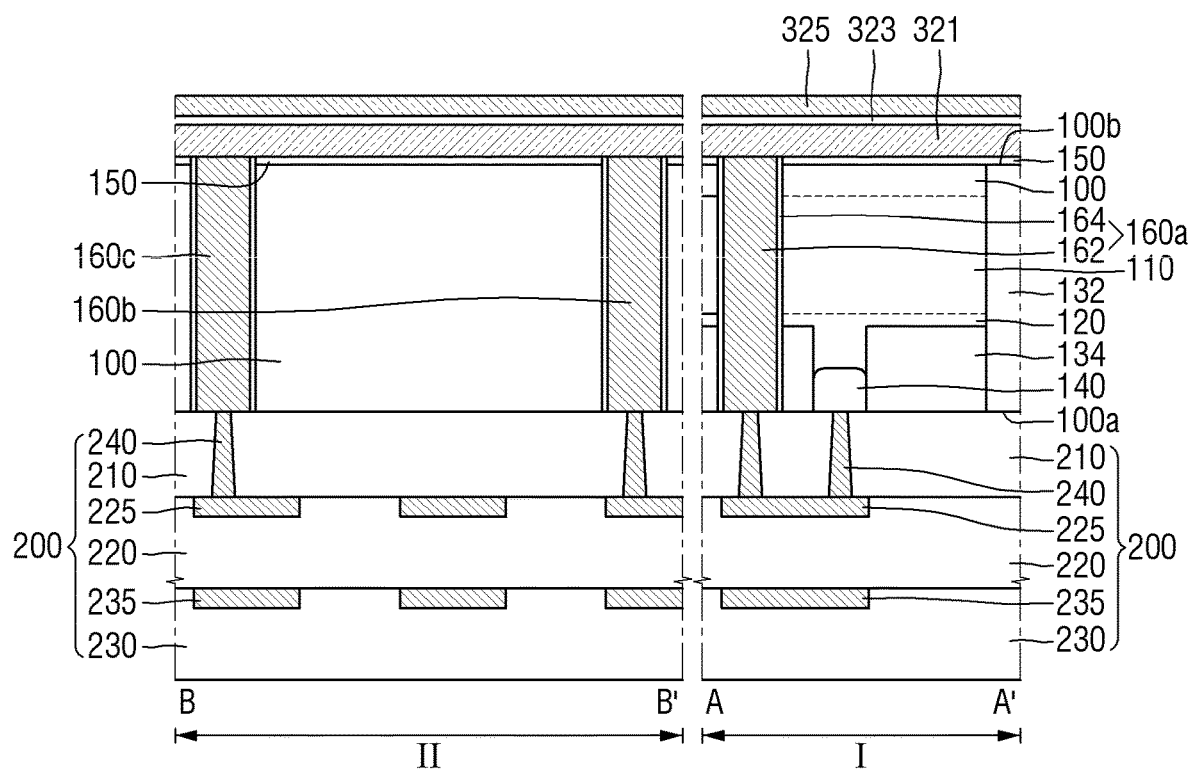

Referring to FIG. 17, a first conductive film 321, a dielectric film 323 and a second conductive film 325 sequentially stacked on the second surface 100b of the substrate 100 are formed.

For example, the first conductive film 321 may be formed to extend along the upper surface of the anti-reflection film 150. The dielectric film 323 may be formed on the first conductive film 321. The second conductive film 325 may be formed on the dielectric film 323.

In some embodiments, the first conductive film 321, the dielectric film 323, and the second conductive film 325 may be formed over the sensor array region I and the peripheral circuit region II. In some embodiments, the first conductive film 321 may include tungsten (W), the dielectric film 323 may include silicon nitride or silicon oxide, and the second conductive film 325 may include titanium nitride (TiN).

Figure 18:
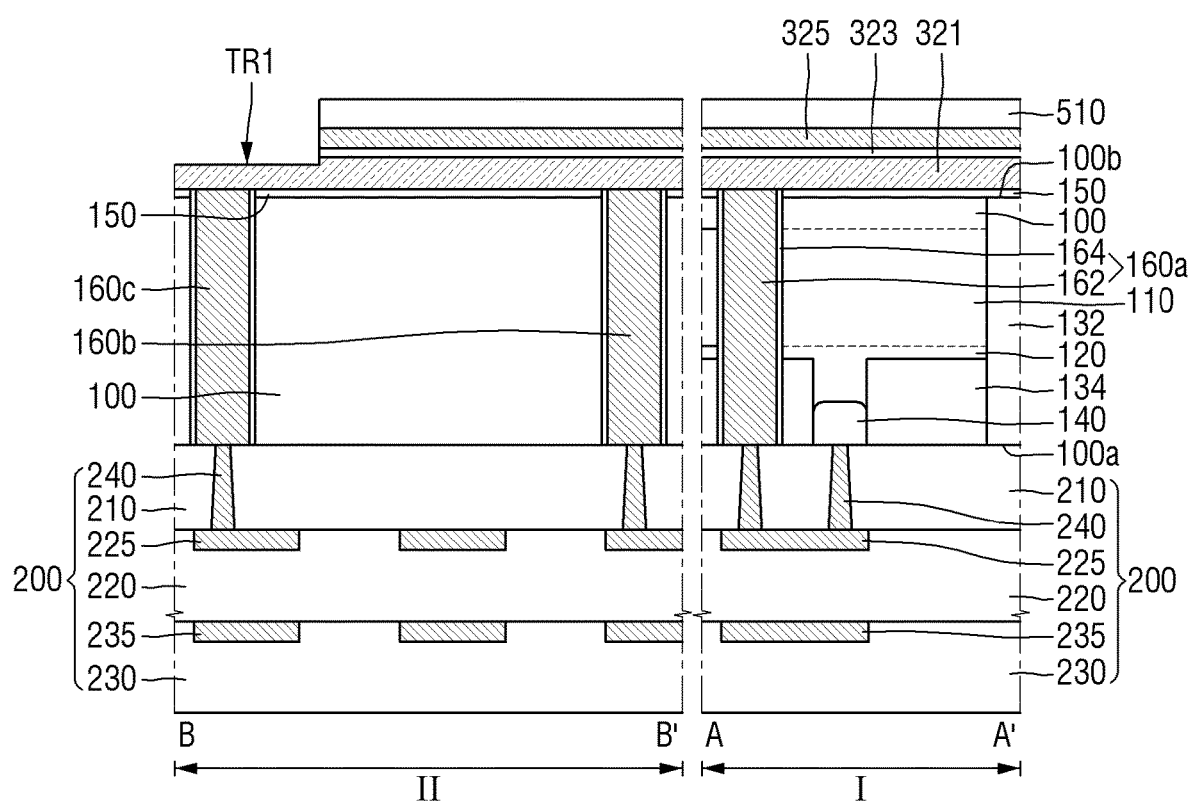

Referring to FIG. 18, the dielectric film 323 and the second conductive film 325 are patterned to expose a part of the upper surface of the first conductive film 321.

For example, a first mask pattern 510 which exposes a part of the upper surface of the second conductive film 325 may be formed on the second conductive film 325. Subsequently, a first etching process of using the first mask pattern 510 as an etching mask may be performed. The first etching process may be performed until the first conductive film 321 is exposed. Thus, the first trench TR1 which exposes a part of the upper surface of the first conductive film 321 may be formed. After the first trench TR1 is formed, the first mask pattern 510 may be removed.

In some embodiments, the first etching process may etch not only the dielectric film 323 and the second conductive film 325 but also a part of the first conductive film 321.

Figure 19:
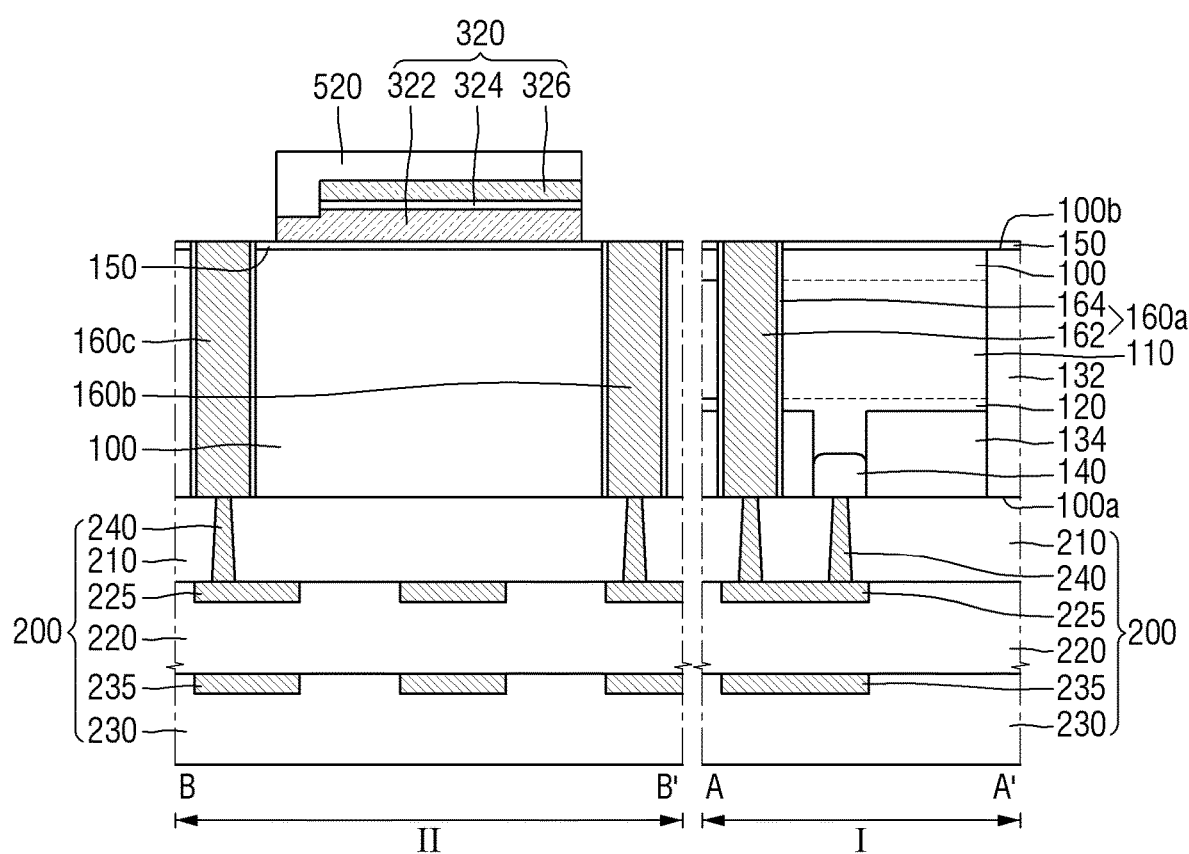

Referring to FIG. 19, the first conductive film 321, the dielectric film 323, and the second conductive film 325 are patterned to form a capacitor structure 320.

For example, a second mask pattern 520 which exposes a part of the upper surface of the second conductive film 325 may be formed on the second conductive film 325. Subsequently, a second etching process which uses the second mask pattern 520 as an etching mask may be performed. The second etching process may be performed, for example, until the anti-reflection film 150 is exposed. As a result, a capacitor structure 320 including the first conductive pattern 322, the dielectric pattern 324 and the second conductive pattern 326 may be formed. After the capacitor structure 320 is formed, the second mask pattern 520 may be removed.

In some embodiments, the second mask pattern 520 may cover at least a part of the bottom surface of the first trench TR1. Therefore, a capacitor structure 320 including the first conductive pattern 322 in which a part of the upper surface is exposed may be formed. In some embodiments, the capacitor structure 320 may be formed on the peripheral circuit region II.

Figure 20:
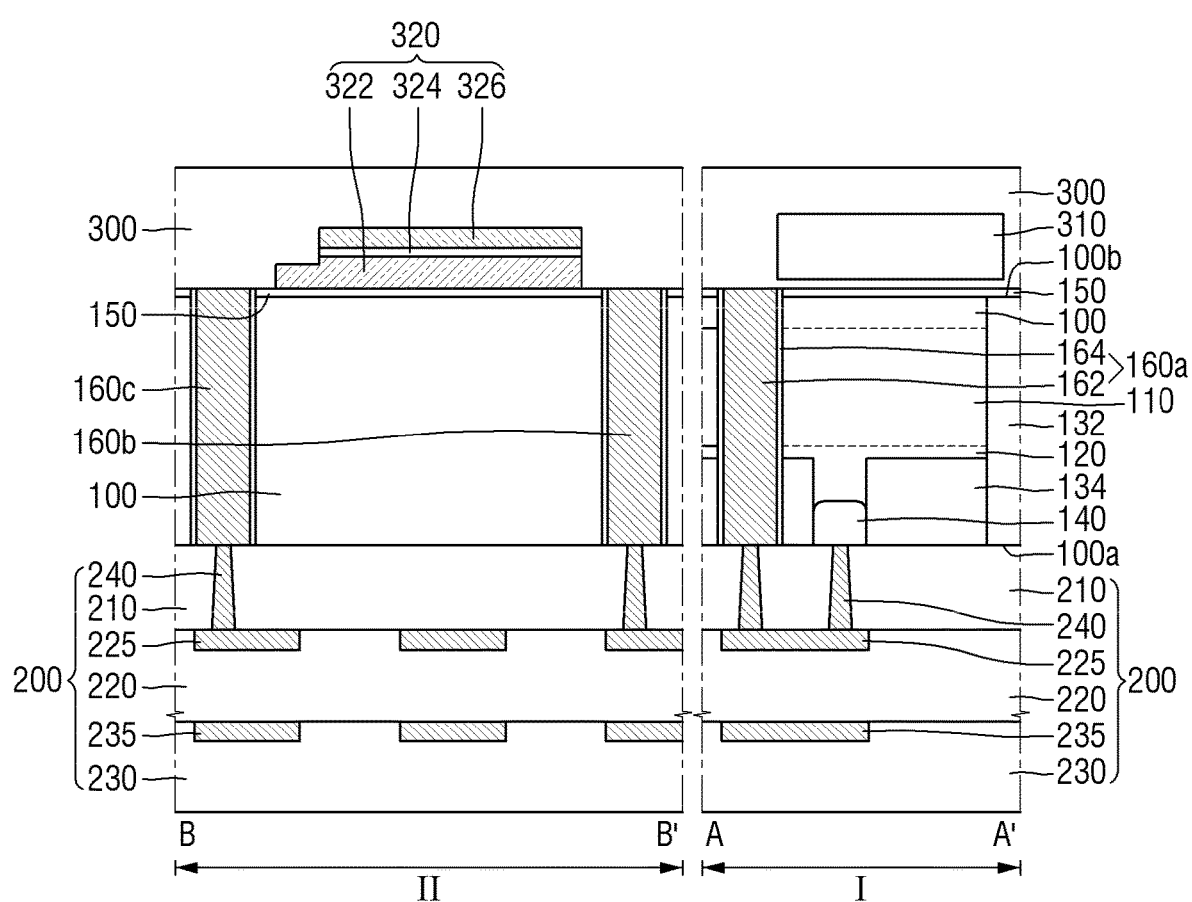

Referring to FIG. 20, a first interlayer insulating film 300 which covers the capacitor structure 320 is formed.

For example, the first interlayer insulating film 300 may be formed on the second surface 100b of the substrate 100.

In some embodiments, the color filter 310 may be formed before forming the first interlayer insulating film 300. The color filter 310 may be formed on the second surface 100b of the substrate 100 of the sensor array region I. Thus, the first interlayer insulating film 300 which covers the color filter 310 and the capacitor structure 320 may be formed.

Figure 21:
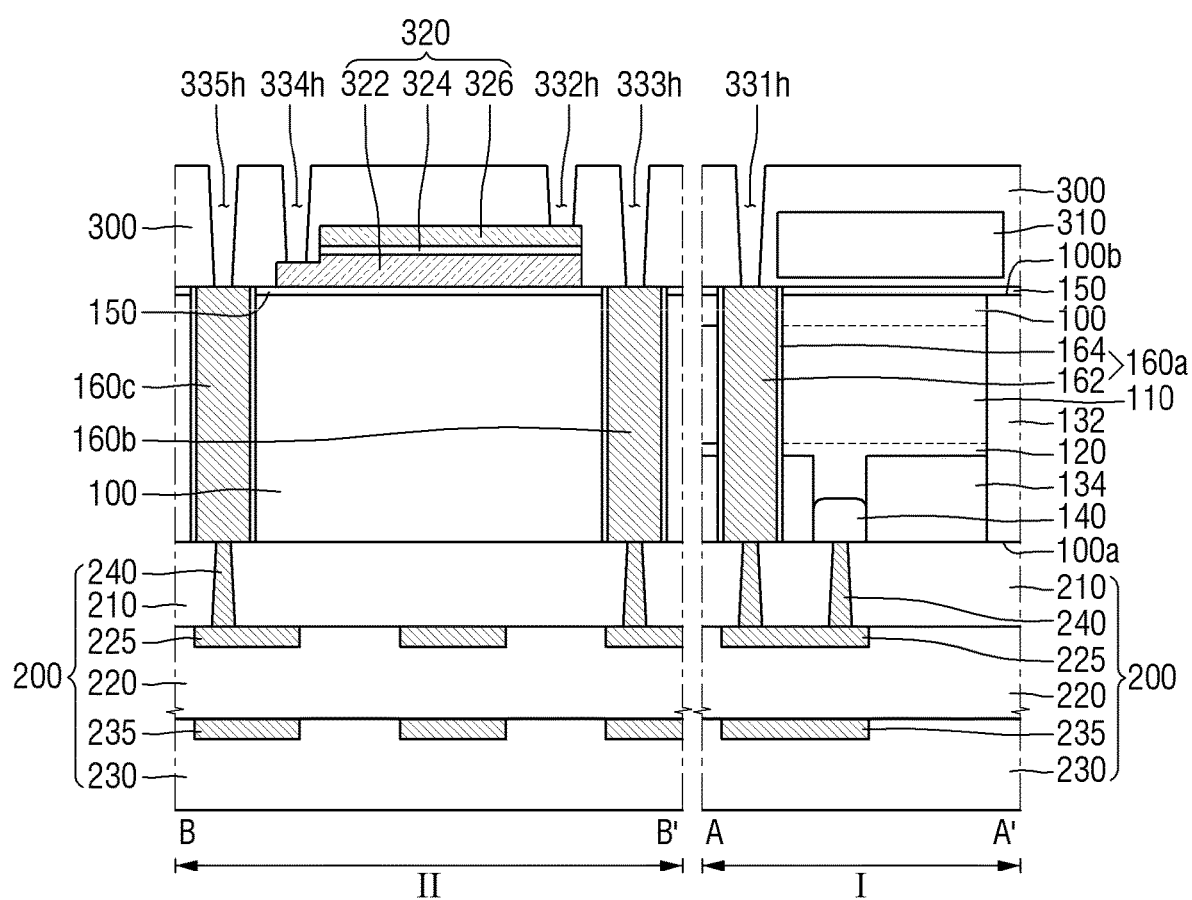

Referring to FIG. 21, first to fifth contact holes 331h, 332h, 333h, 334h, 335h are formed in the first interlayer insulating film 300.

The first contact hole 331h may expose the upper surface of the first penetration via 160a, the second contact hole 332h may expose the upper surface of the second conductive pattern 326, the third contact hole 333h may expose the upper surface of the second penetration via 160b, the fourth contact hole 334h may expose the upper surface of the first conductive pattern 322, and the fifth contact hole 333h may expose the upper surface of the third penetration via 160c.

Figure 22:
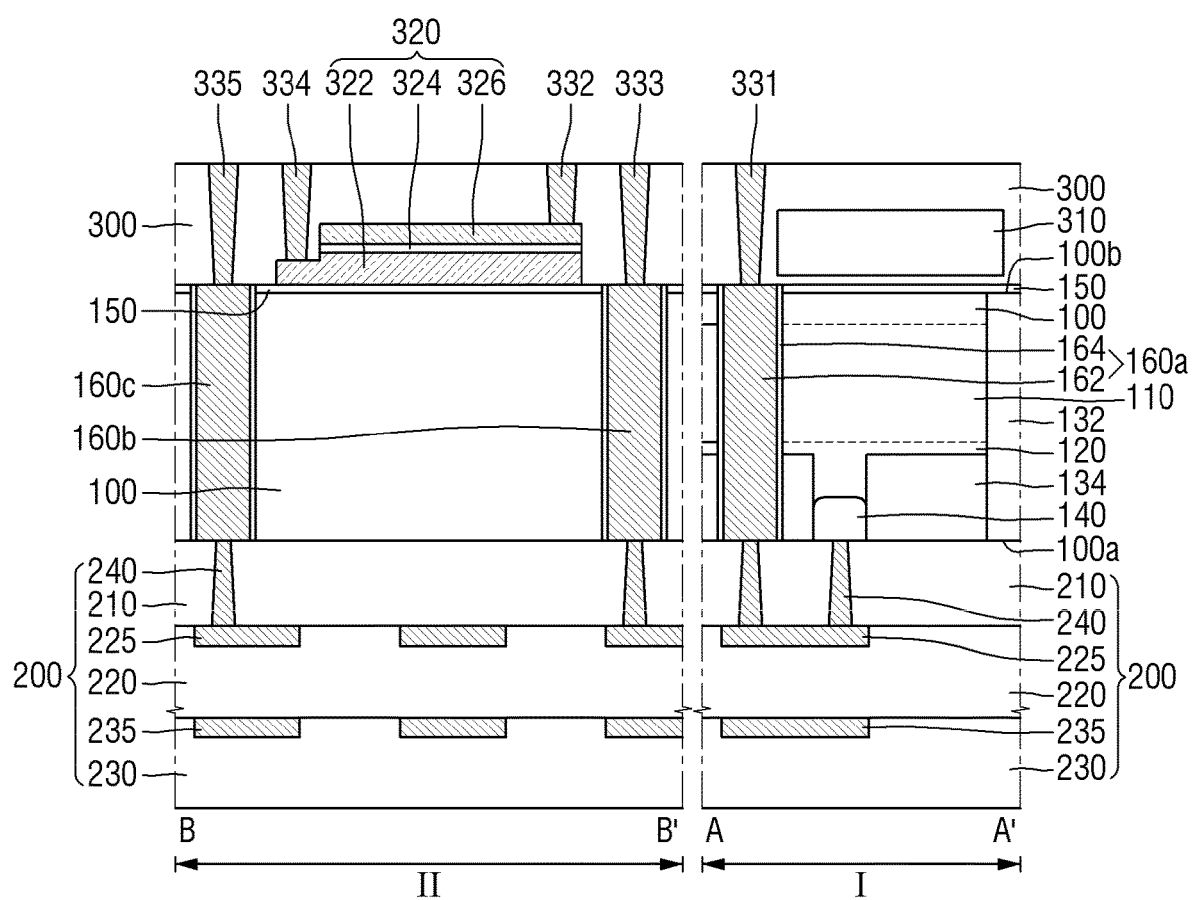

Referring to FIG. 22, a first contact 331, and a third to a sixth contact 331, 332, 333, 334, 335 which fill each of the first to fifth contact holes 331h, 332h, 333h, 334h, 335h are formed.

For example, after forming a conductive film that fills the first to fifth contact holes 331h, 332h, 333h, 334h, 335h, a planarization process may be performed.

Figure 23:
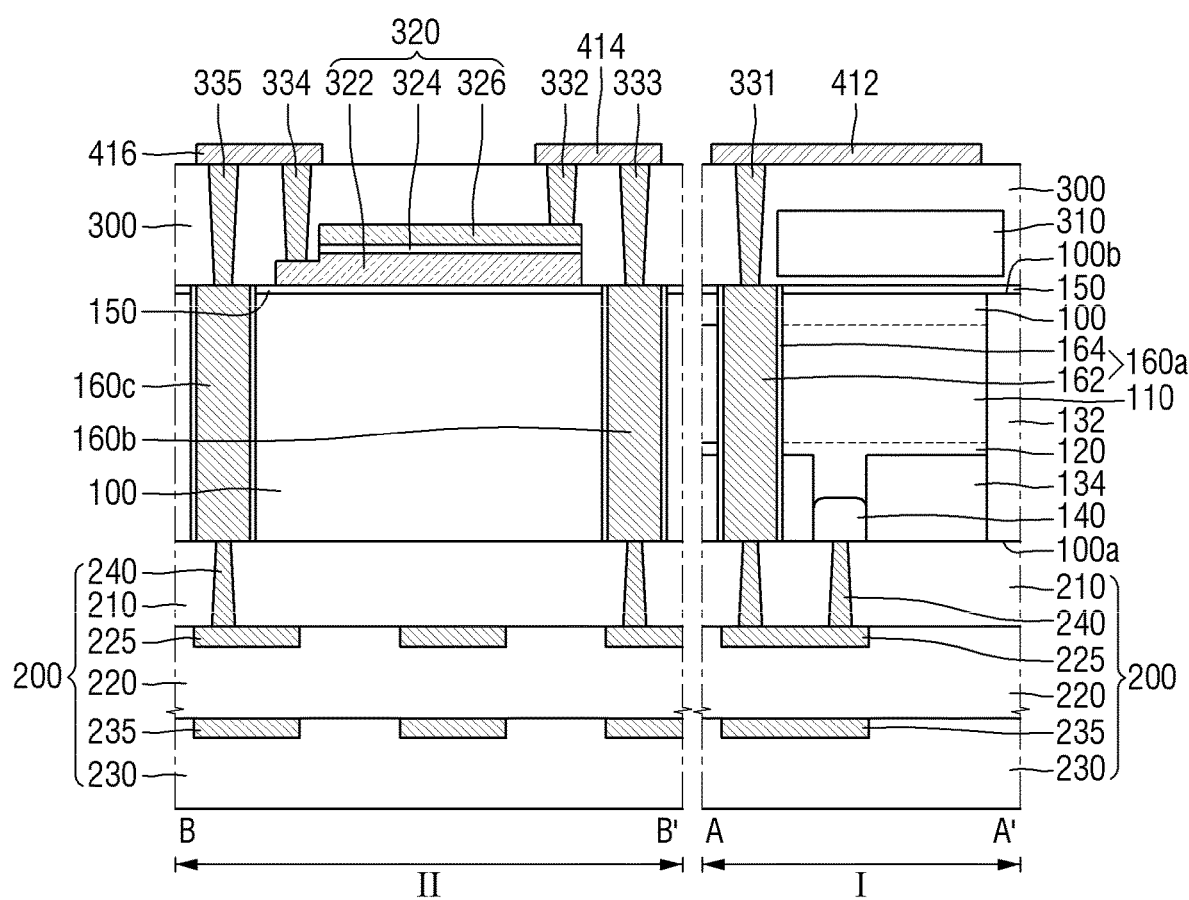

Referring to FIG. 23, a first electrode 412, a first wiring 414 and a second wiring 416 are formed on the first interlayer insulating film 300.

For example, an ITO may be formed along the upper surface of the first interlayer insulating film 300, and the formed ITO may be patterned. Thus, a first electrode 412, a first wiring 414 and a second wiring 416 extending along the upper surface of the first interlayer insulating film 300 may be formed.

The first electrode 412 may be formed on the first interlayer insulating film 300 of the sensor array region I. In some embodiments, the first wiring 414 and the second wiring 416 may be formed on the first interlayer insulating film 300 of the peripheral circuit region II.

In some embodiments, the first electrode 412 may be patterned to be connected to the first contact 331, the first wiring 414 may be patterned to be connected to the third contact 332 and the fourth contact 333, and the second wiring 416 may be patterned to be connected to the fifth contact 334 and the sixth contact 335.

Next, referring to FIG. 5, a second photoelectric conversion layer 420, a second electrode 430, a protective layer 440, and a micro lens 450 are formed on the first electrode 412. Further, a second interlayer insulating film 400 is formed on the first wiring 414 and the second wiring 416.

Therefore, the image sensor according to FIG. 5 may be fabricated.

While some example embodiments have been particularly shown and described, it will be understood by one of ordinary skill in the art that variations in form and detail may be made therein without departing from the spirit and scope of the claims.

What is claimed is:

1. An image sensor comprising:
    a substrate including a first surface and a second surface, the second surface being opposite the first surface and configured to be light incident;
    a first photoelectric conversion layer in the substrate;
    a wiring structure on the first surface of the substrate, the wiring structure including a plurality of wiring layers;
    an interlayer insulating film on the second surface of the substrate;
    a capacitor structure in the interlayer insulating film, the capacitor structure including a first conductive pattern, a dielectric pattern, and a second conductive pattern sequentially stacked on the second surface of the substrate; and
    a first wiring on the interlayer insulating film, the first wiring being connected to the second conductive pattern;
    a first electrode on the interlayer insulating film, the first electrode being spaced apart from the first wiring;
    a second photoelectric conversion layer on the first electrode; and
    a second electrode on the second photoelectric conversion layer,
        the image sensor being configured to apply a different level of a voltage to the first electrode compared to the second electrode.

2. The image sensor of claim 1, further comprising:
    a contact penetrating the interlayer insulating film, wherein
    the contact is connected to the second conductive pattern and the first wiring.

3. The image sensor of claim 1, further comprising:
    a penetration via penetrating the substrate and extending from the first surface to the second surface, and
    a contact penetrating the interlayer insulating film and connecting the first wiring and the penetration via.

4. The image sensor of claim 1, further comprising:
    a third conductive pattern spaced apart from the first conductive pattern and extending along the second surface of the substrate; and
    a contact penetrating the interlayer insulating film, wherein
    the contact is connected to the first wiring and the third conductive pattern.

5. The image sensor of claim 1, further comprising:
    a second wiring on the interlayer insulating film, the second wiring being spaced apart from the first wiring; and
    a first contact penetrating the interlayer insulating film, the first contact being connected to the first conductive pattern and the second wiring.

6. The image sensor of claim 5, further comprising:
    a penetration via penetrating the substrate, the penetration via extending from the first surface to the second surface; and
    a second contact penetrating the interlayer insulating film, the second contact being connected to the second wiring and the penetration via.

7. The image sensor of claim 1, wherein the dielectric pattern exposes a part of an upper surface of the first conductive pattern.

8. The image sensor of claim 1, wherein the first wiring includes ITO (Indium Tin Oxide).

9. The image sensor of claim 1, wherein the first wiring and the first electrode are at a same level.

10. An image sensor comprising:
a substrate including a sensor array region and a peripheral circuit region, the substrate including a first surface and a second surface, the second surface being opposite the first surface and configured to be light incident;
a first photoelectric conversion layer in the sensor array region;
a color filter on the second surface of the sensor array region;
a capacitor structure on the second surface of the peripheral circuit region, the capacitor structure including a first conductive pattern, a dielectric pattern, and a second conductive pattern sequentially stacked;
an interlayer insulating film that covers the color filter and the capacitor structure;
a first electrode that extends along an upper surface of the interlayer insulating film in the sensor array region;
a second photoelectric conversion layer on the first electrode; and
a first wiring extending along an upper surface of the interlayer insulating film in the peripheral circuit region, the first wiring being connected to the second conductive pattern.

11. The image sensor of claim 10, wherein a material configuration of the first electrode and a material configuration of the first wiring are substantially the same.

12. The image sensor of claim 10, wherein a thickness of the first electrode and a thickness of the first wiring are substantially equal.

13. The image sensor of claim 10, wherein
the first photoelectric conversion layer is a semiconductor photoelectric conversion element, and
the second photoelectric conversion layer is an organic photoelectric conversion element.

14. An image sensor comprising:
a substrate including a first surface and a second surface, the second surface opposite the first surface and configured to be light incident;
a first photoelectric conversion layer in the substrate,
a capacitor structure on the second surface of the substrate, the capacitor structure including a first conductive pattern, a dielectric pattern and a second conductive pattern sequentially stacked;
an interlayer insulating film that covers the capacitor structure;
a first wiring extending along a part of an upper surface of the interlayer insulating film, the first wiring including indium tin oxide (ITO); and
a first contact penetrating the interlayer insulating film, the first contact being connected to the second conductive pattern and the first wiring,
the image sensor being configured to apply different voltages to the first conductive pattern and the second conductive pattern.

15. The image sensor of claim 14, wherein a width of the first contact increases as a distance of a corresponding portion of the first contact away from the second surface of the substrate increases.

16. The image sensor of claim 14, wherein
the first conductive pattern includes a first portion and a second portion,
the first portion overlaps the second conductive pattern, and
the second portion does not overlap the second conductive pattern.

17. The image sensor of claim 16, wherein
the dielectric pattern overlaps the first portion of the first conductive pattern, and
the dielectric pattern does not overlap the second portion of the first conductive pattern.

18. The image sensor of claim 16, wherein a thickness of the second portion of the first conductive pattern is smaller than a thickness of the first portion of the first conductive pattern.

19. The image sensor of claim 16, further comprising:
a third conductive pattern spaced apart from the first conductive pattern, the third conductive pattern extending along the second surface of the substrate; and
a second contact penetrating the interlayer insulating film, the second contact being connected to the first wiring and the third conductive pattern, wherein
a thickness of the third conductive pattern is substantially equal to a thickness of the first portion of the first conductive pattern.

* * * * *